United States Patent
Lee et al.

(10) Patent No.: US 9,076,813 B1
(45) Date of Patent: Jul. 7, 2015

(54) GATE-ALL-AROUND METAL-OXIDE-SEMICONDUCTOR TRANSISTORS WITH GATE OXIDES

(71) Applicants: Seung-Chang Lee, Albuquerque, NM (US); Steven Brueck, Albuquerque, NM (US); Daniel Feezell, Albuquerque, NM (US)

(72) Inventors: Seung-Chang Lee, Albuquerque, NM (US); Steven Brueck, Albuquerque, NM (US); Daniel Feezell, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 0 days.

(21) Appl. No.: 14/156,176

(22) Filed: Jan. 15, 2014

Related U.S. Application Data

(60) Provisional application No. 61/752,741, filed on Jan. 15, 2013.

(51) Int. Cl.
| | |
|---|---|
| H01L 21/336 | (2006.01) |
| H01L 29/66 | (2006.01) |
| H01L 21/28 | (2006.01) |
| H01L 29/78 | (2006.01) |
| B82Y 15/00 | (2011.01) |

(52) U.S. Cl.
CPC ........... *H01L 29/66469* (2013.01); *B82Y 15/00* (2013.01); *H01L 21/28264* (2013.01); *H01L 29/7841* (2013.01)

(58) Field of Classification Search
USPC ........................................................ 438/197
See application file for complete search history.

(56) References Cited

U.S. PATENT DOCUMENTS

| | | | |
|---|---|---|---|
| 7,154,118 B2 | 12/2006 | Lindert et al. | |
| 7,456,476 B2* | 11/2008 | Hareland et al. | 257/349 |
| 2013/0153996 A1* | 6/2013 | Chang et al. | 257/334 |
| 2013/0207079 A1* | 8/2013 | Sleight et al. | 257/24 |

OTHER PUBLICATIONS

P.D. Ye et al., "GaAs metal-oxide-semiconductor field-effect transistor with nanometer-thin dielectric grown by atomic layer deposition", Applied Physics Letters vol. 83, No. 1, Jul. 7, 2013, pp. 180-182.
S.C. Lee et al., "Faceting of a quasi-two-dimensional GaAs crystal in nanoscale patterned growth", Applied Physics Letters 92, 023103, 2008, pp. 023103-1-023103-3.
Jerome K. Hyun et al., "Nanowire Heterostructures", Annu. Rev. Mater. Res. 43, 2013, pp. 451-470.
Adele C. Tamboli et al., "Photoelectrochemical Undercut Etching of m-Plane GaN for Microdisk Applications", J. Electrochem. Soc. vol. 56, Issue 10, 2009, pp. H767-H771.
Giovanni Crupi et al., "A comprehensive review on microwave FinFET modeling for progressing beyond the state of art", Solid-State Electronics V. 80, 2013, pp. 81-95.
Hwei-Heng Wang et al., "Liquid Phase Chemical-Enhanced Oxidation for GaAs Operated Near Room Temperature", Jpn. J. Appl. Phys. vol. 37, 1998, pp. L 67-L 70.

* cited by examiner

*Primary Examiner* — Karen Kusumakar
(74) *Attorney, Agent, or Firm* — MH2 Technology Law Group, LLP

(57) ABSTRACT

A method and structure for a semiconductor transistor, including various embodiments. In embodiments, a transistor channel can be formed between a semiconductor source and a semiconductor drain, wherein a transistor gate oxide completely surrounds the transistor channel and a transistor gate metal that completely surrounds the transistor gate oxide. Related fabrication processes are presented for similar device embodiments based on a Group III-V semiconductor material and silicon-on-insulator materials.

15 Claims, 16 Drawing Sheets

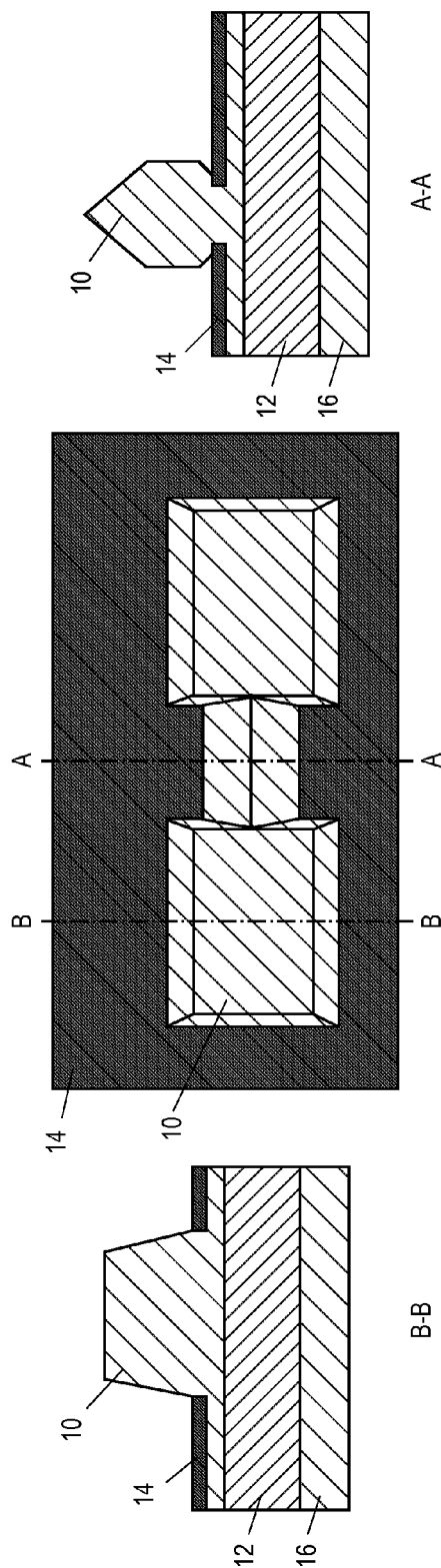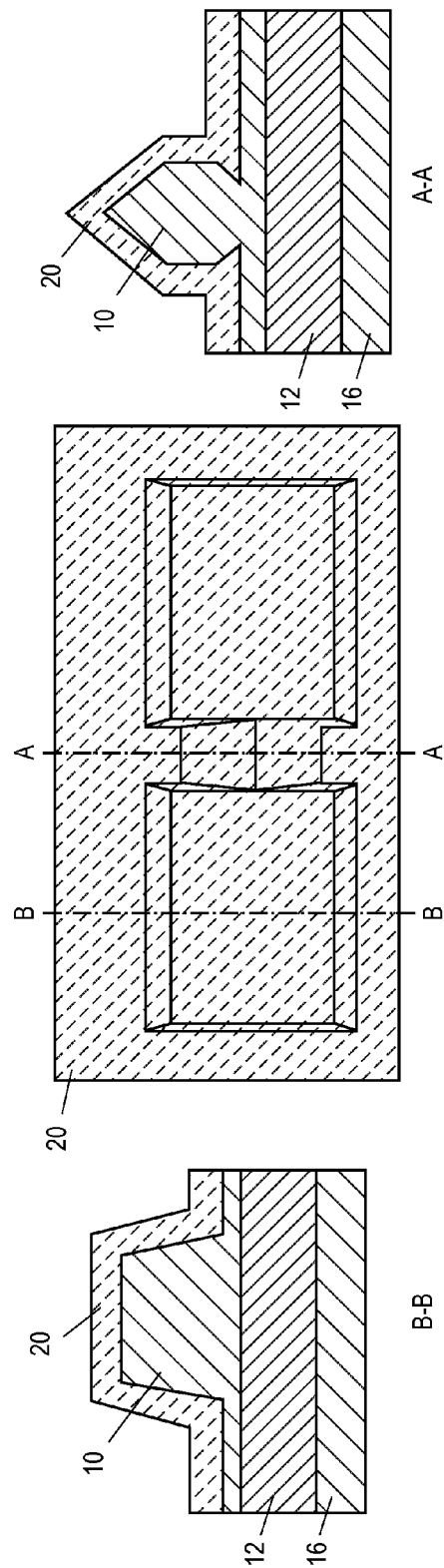

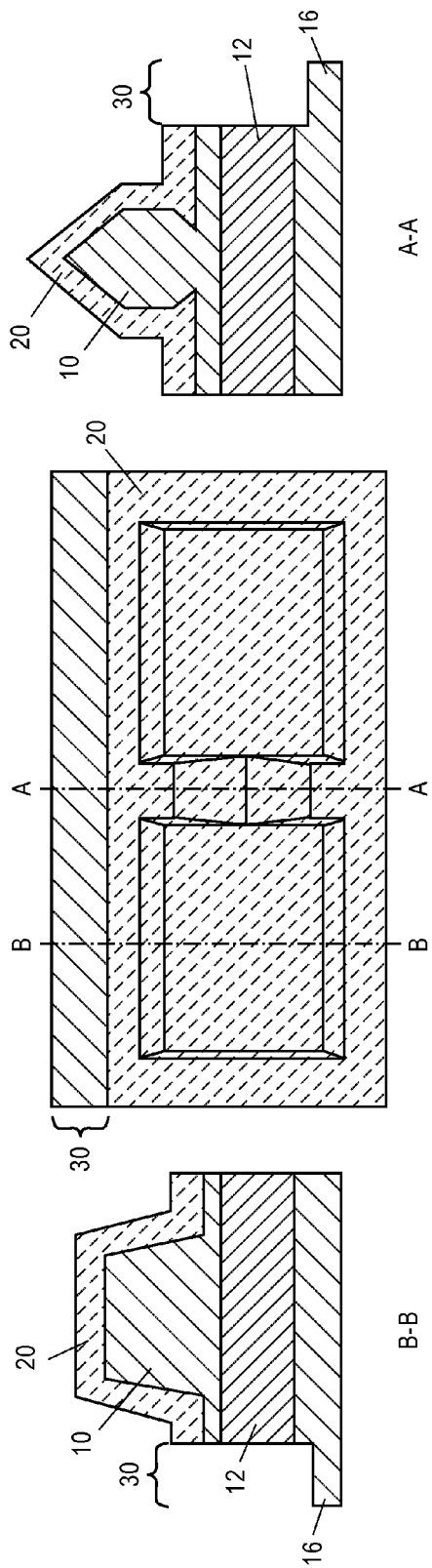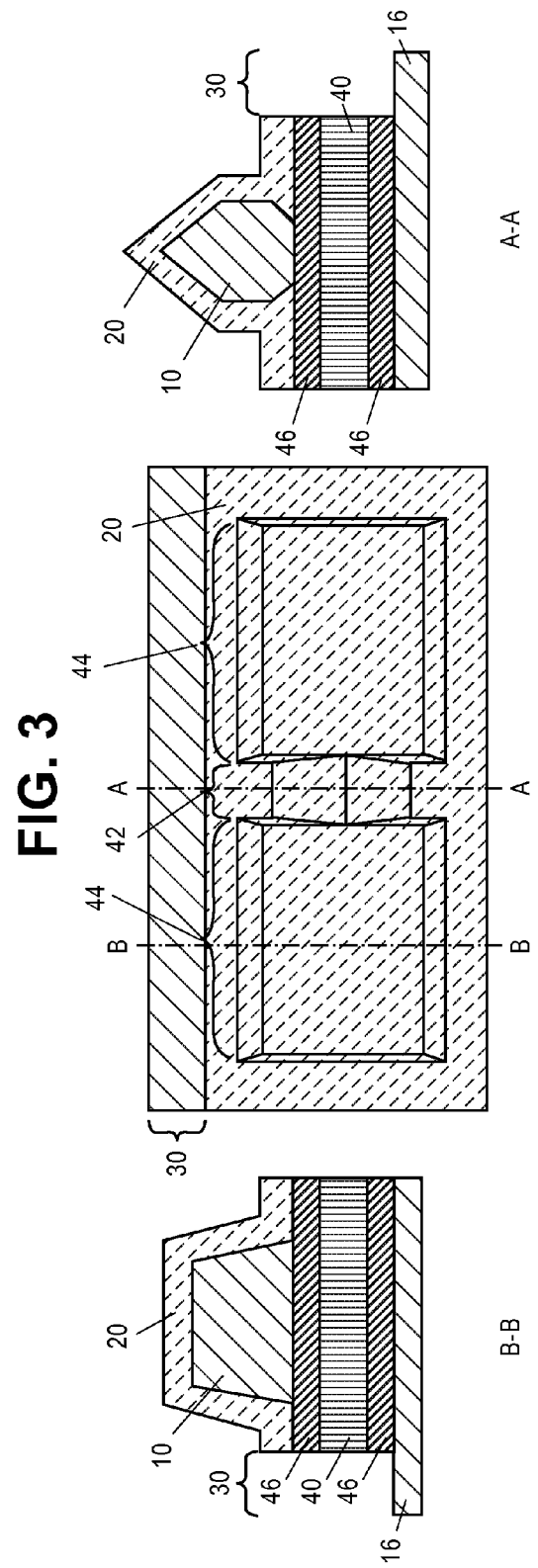

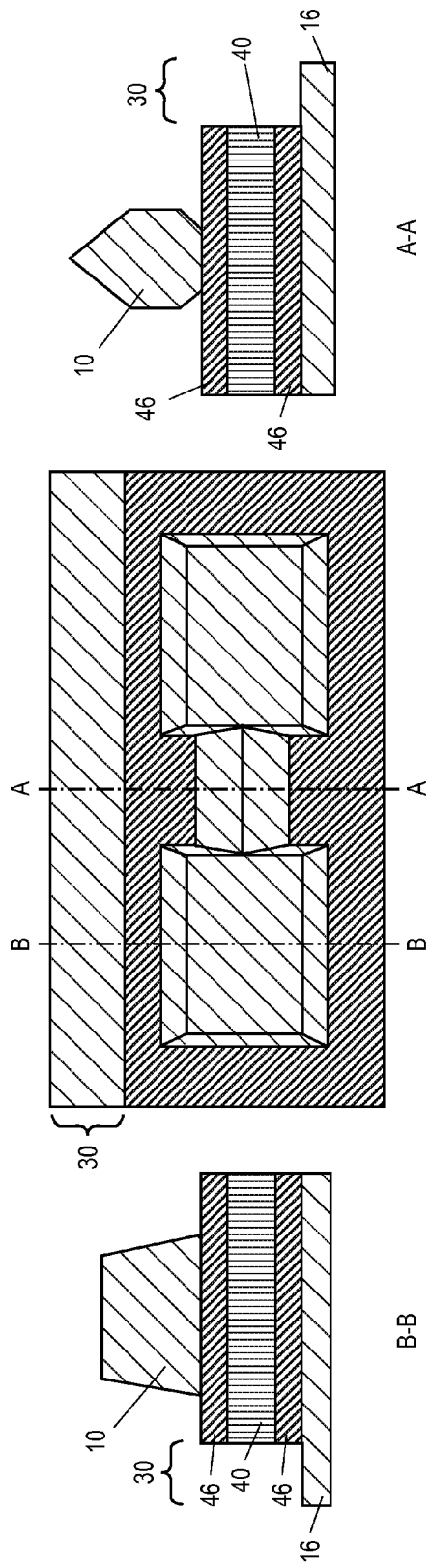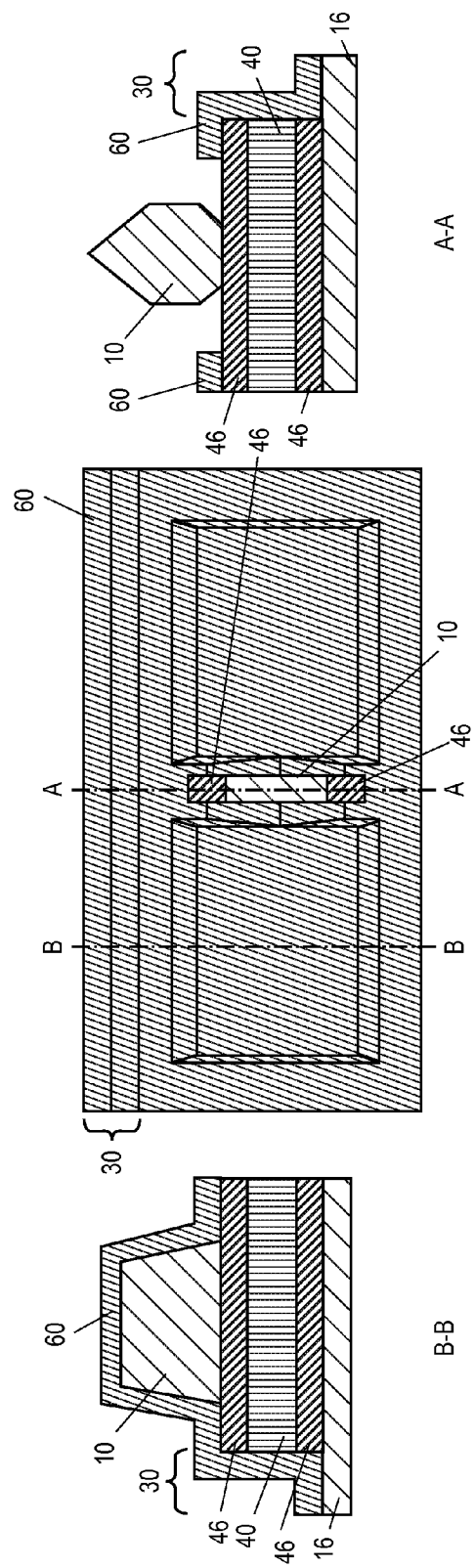

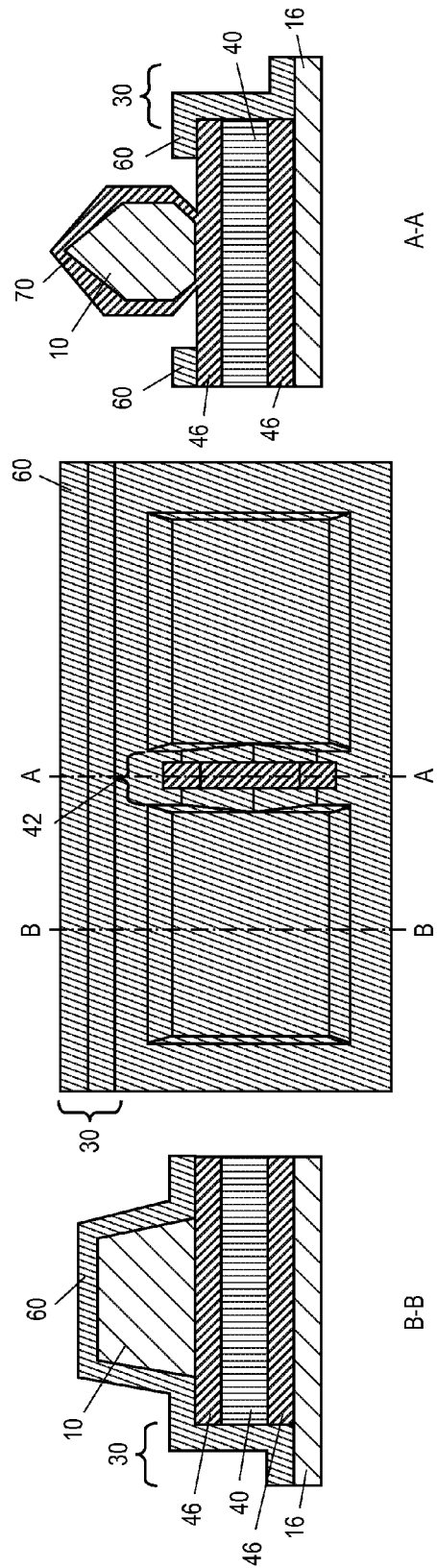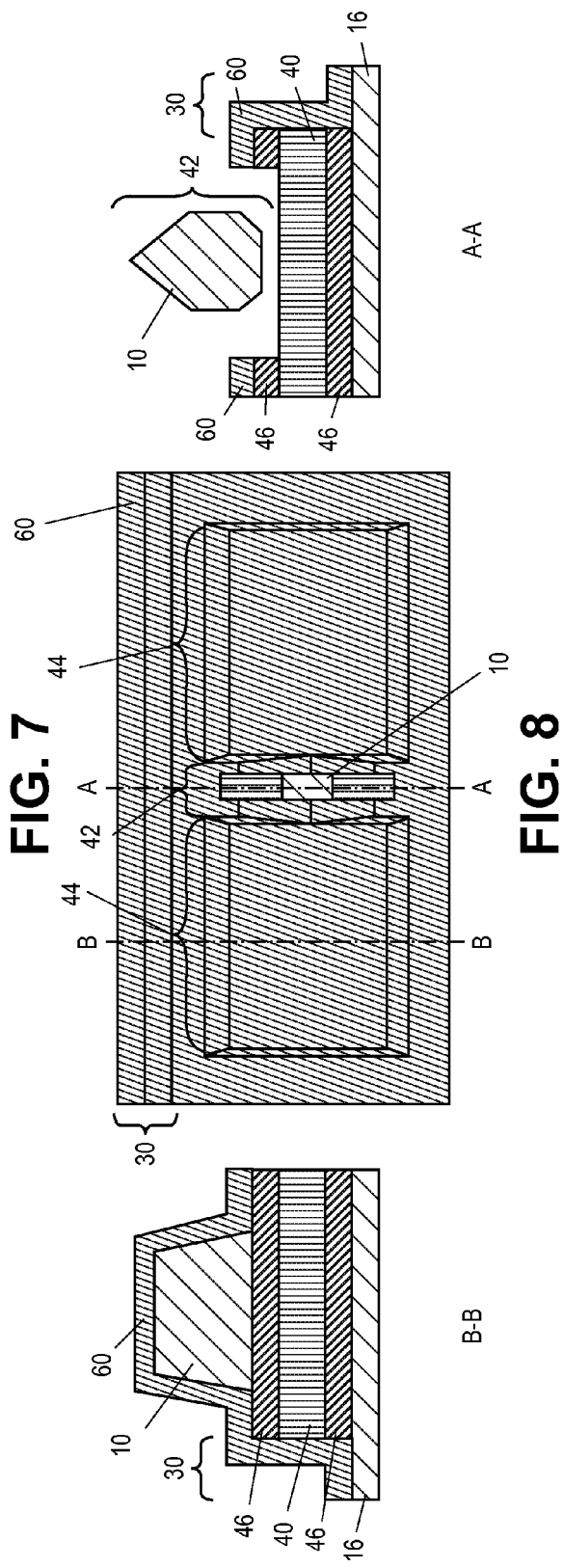
FIG. 7
FIG. 8

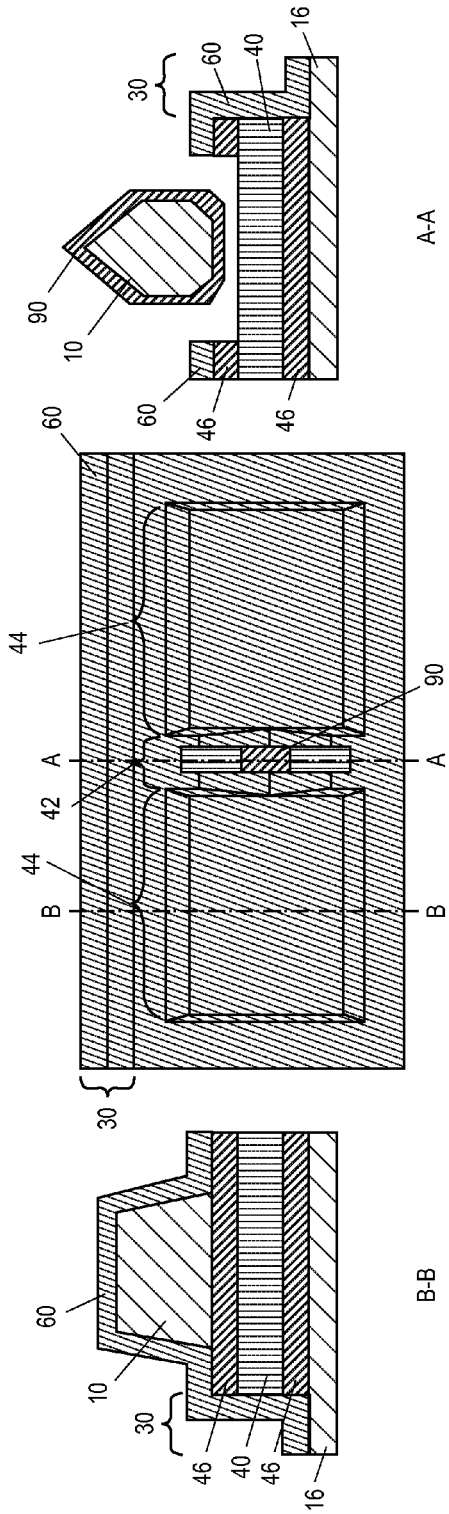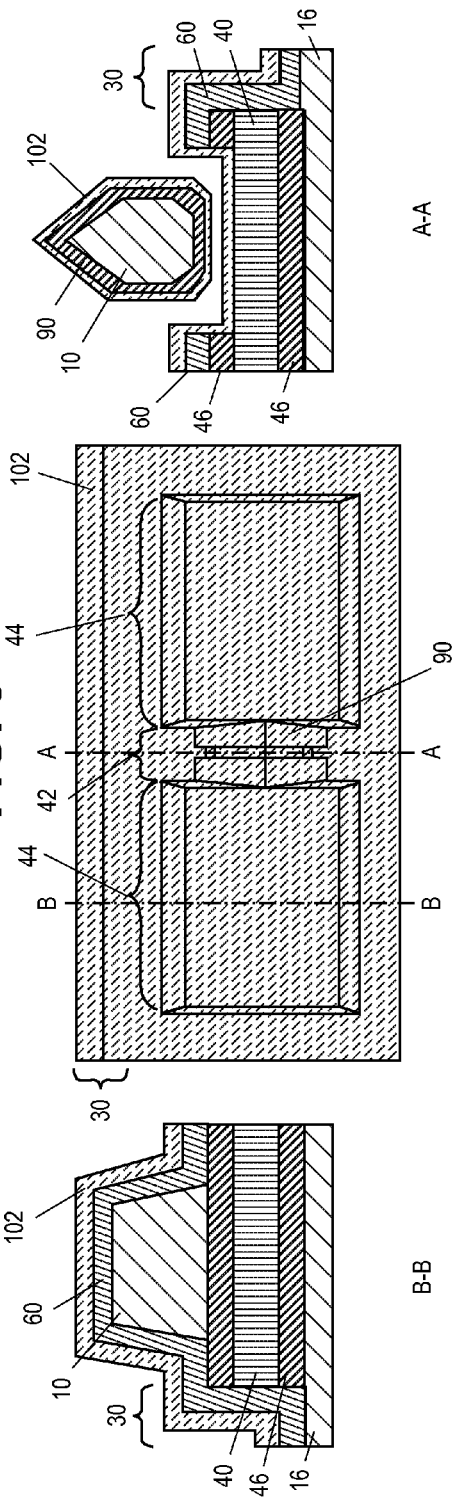

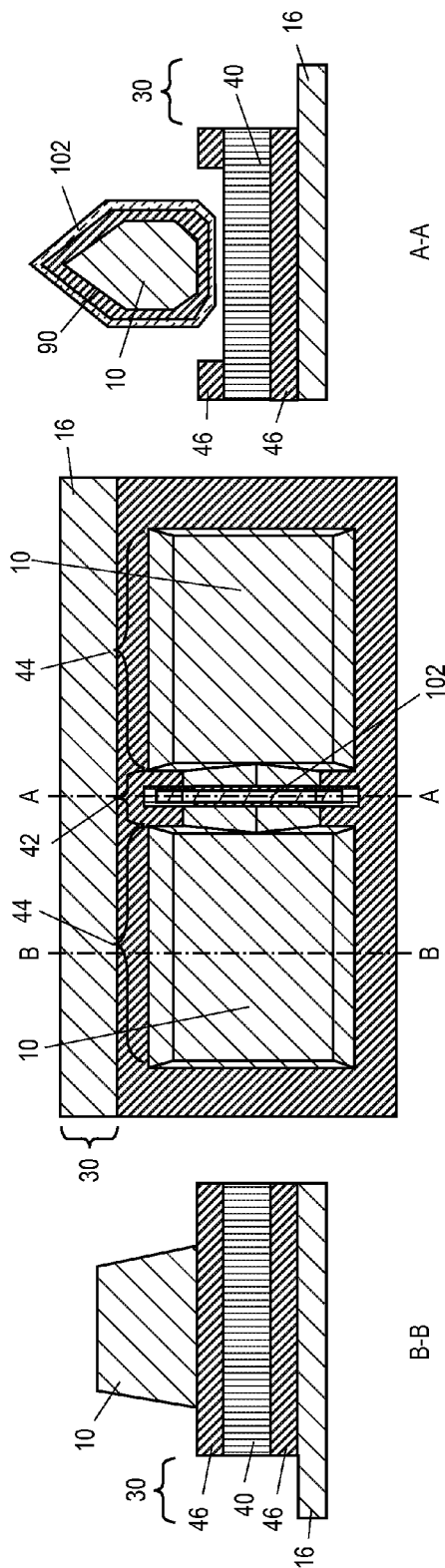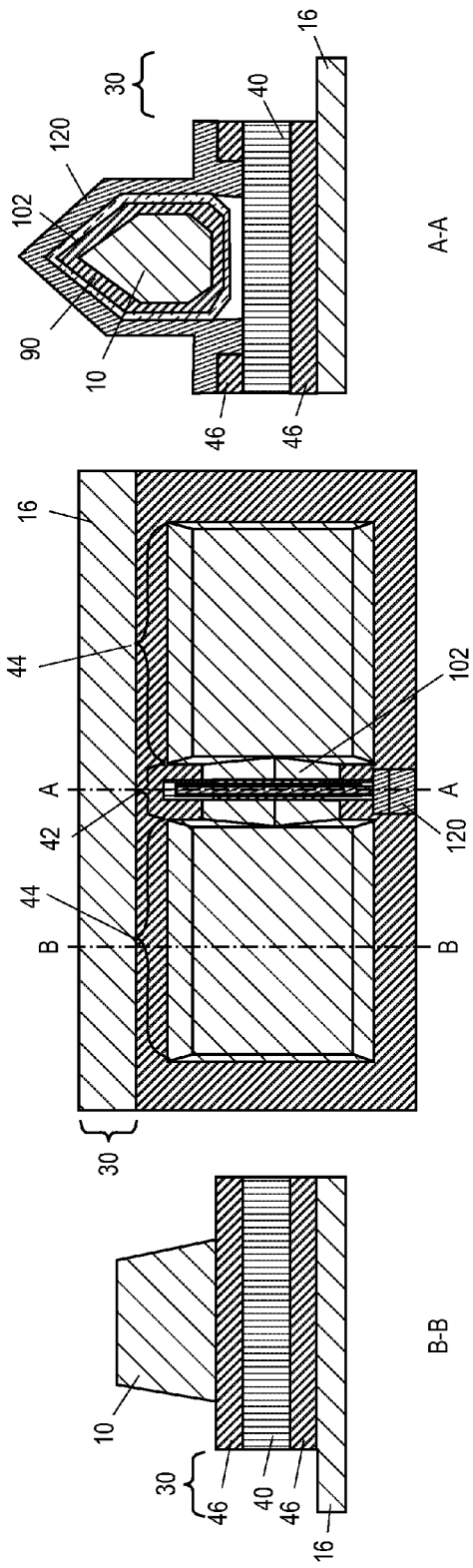
FIG. 11
FIG. 12

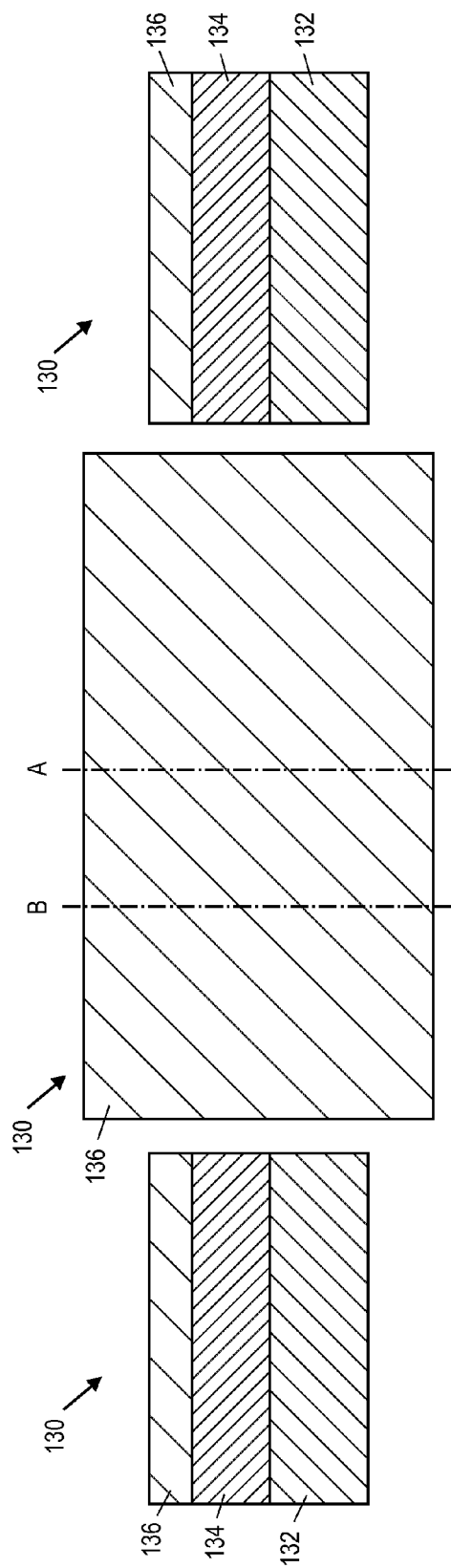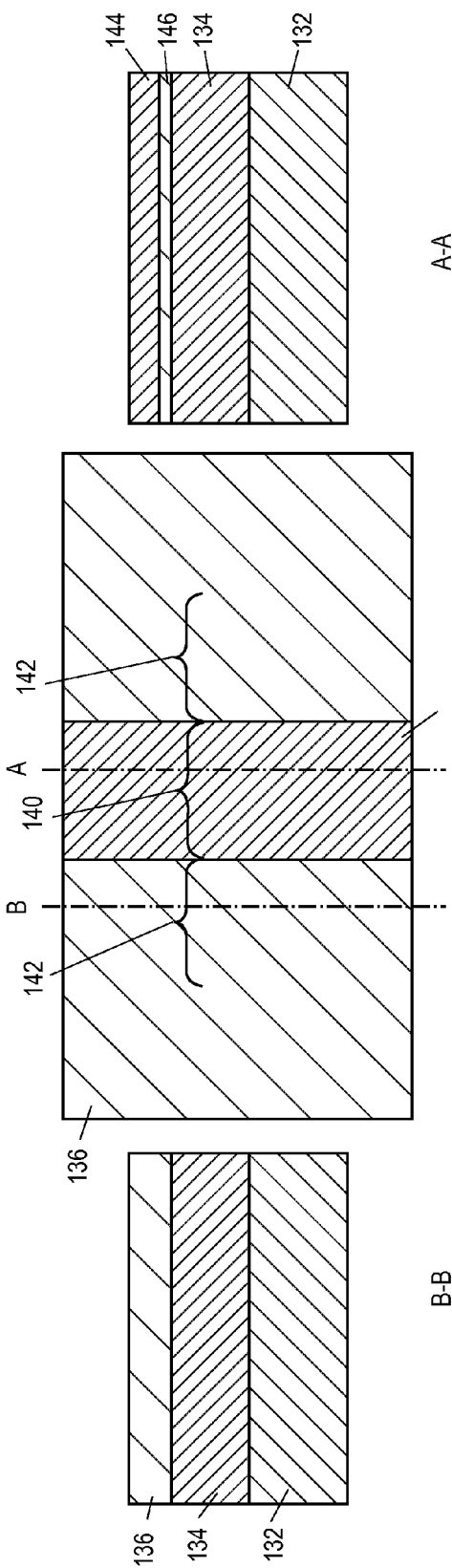

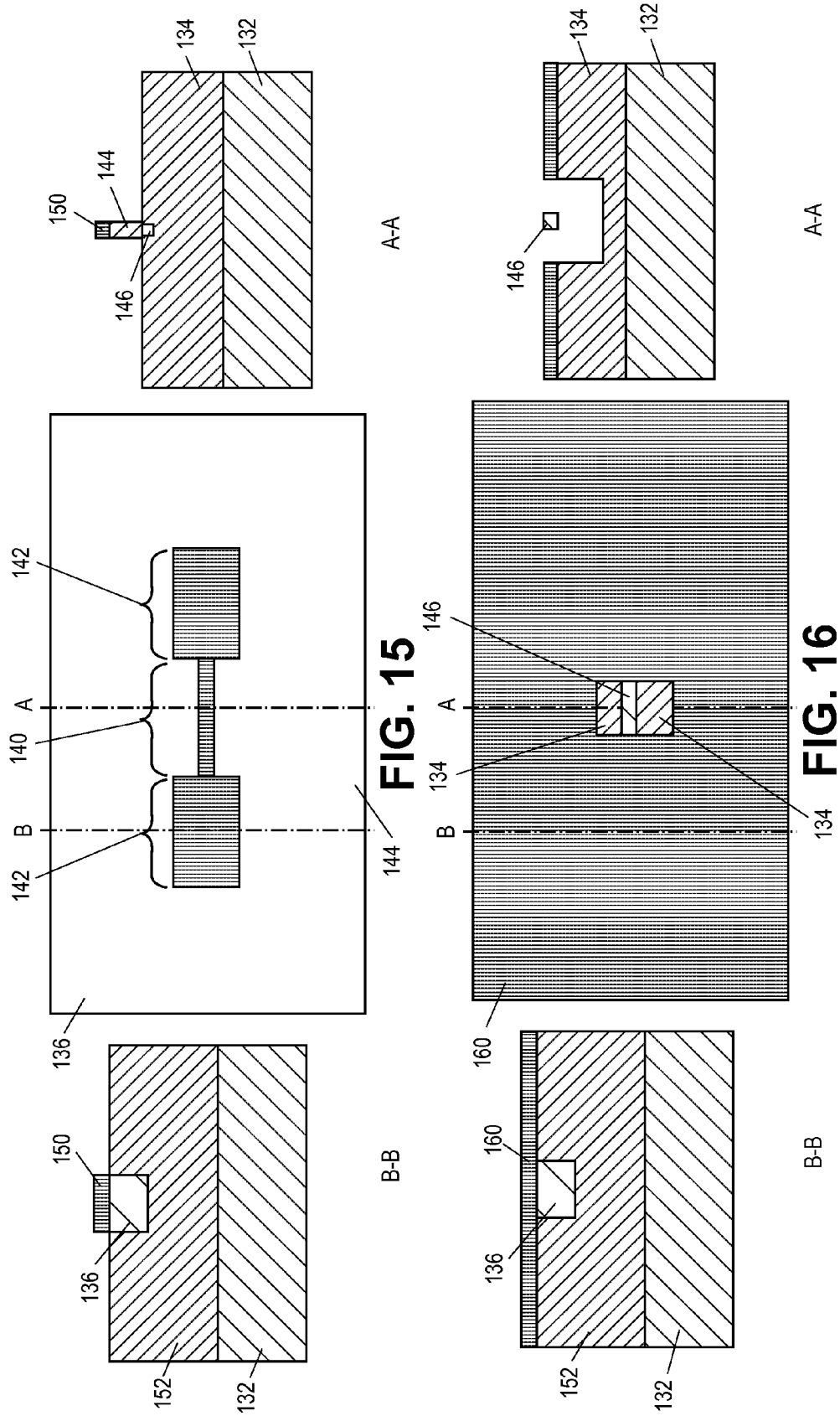

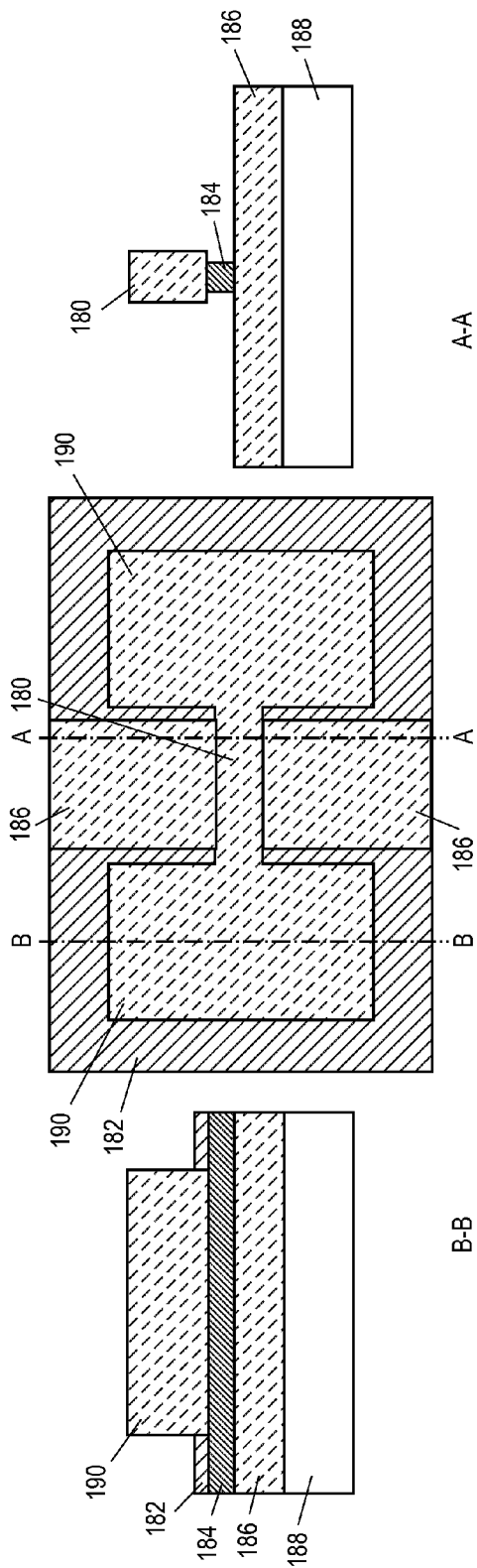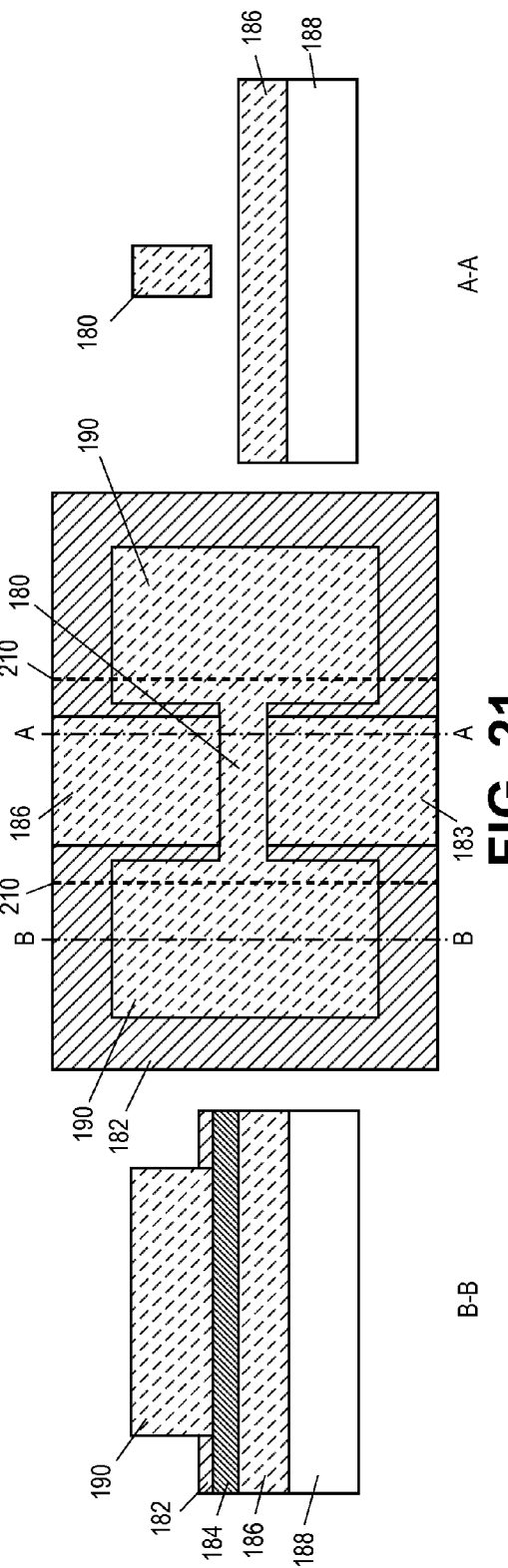

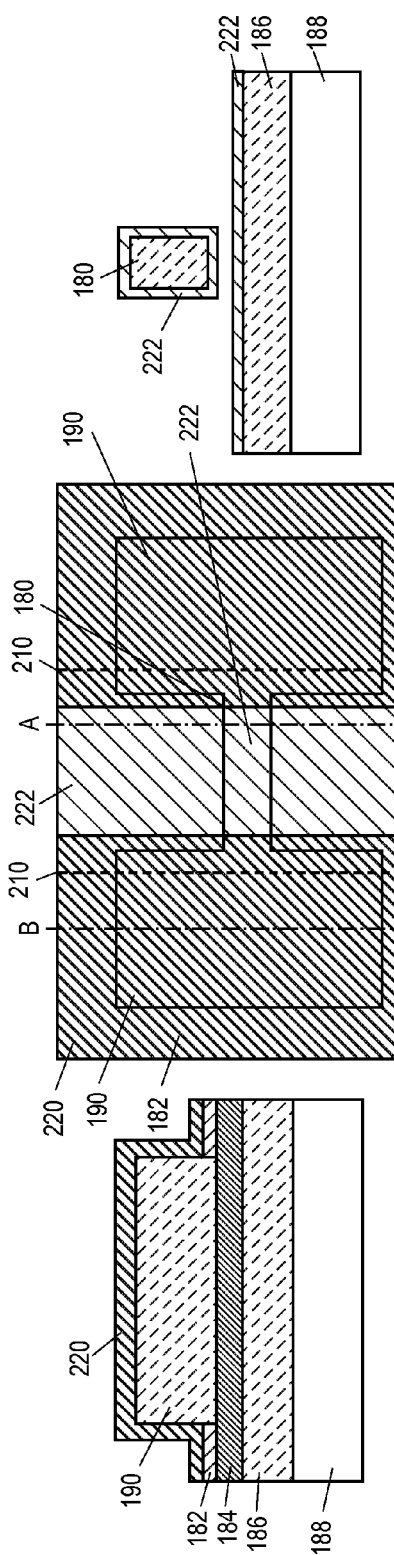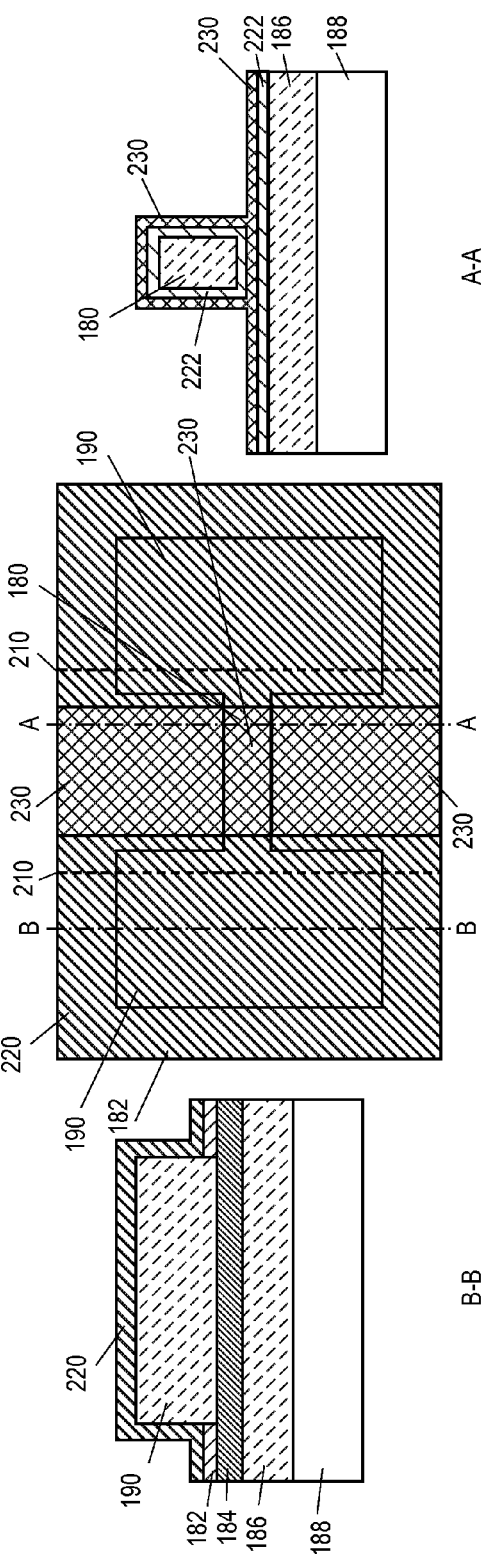

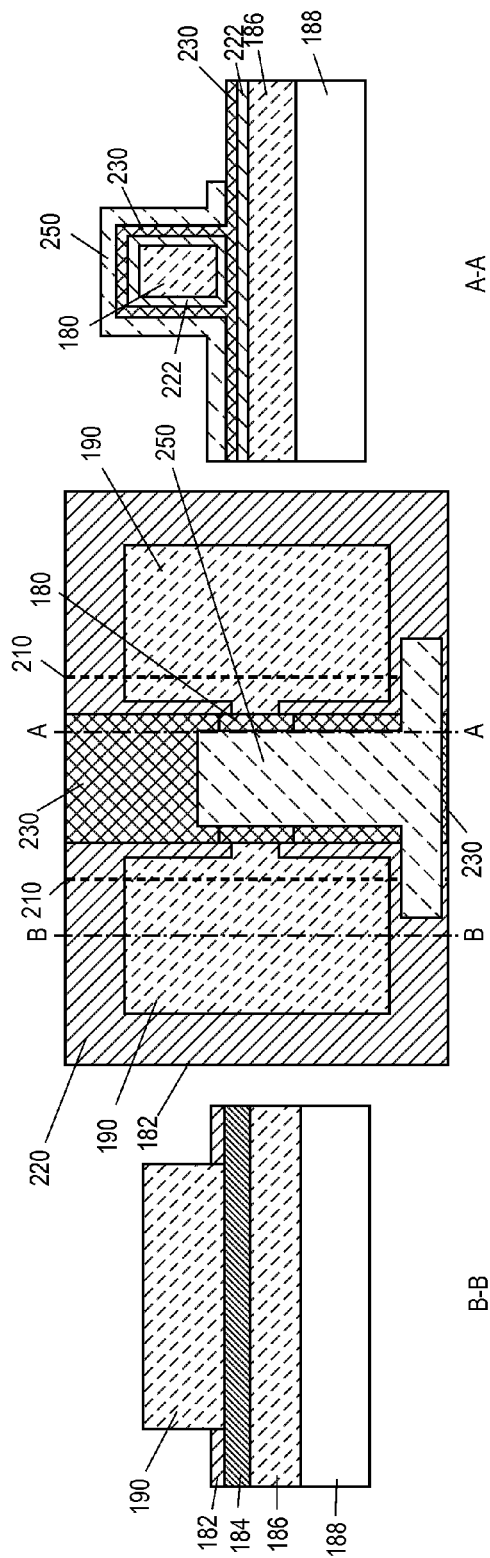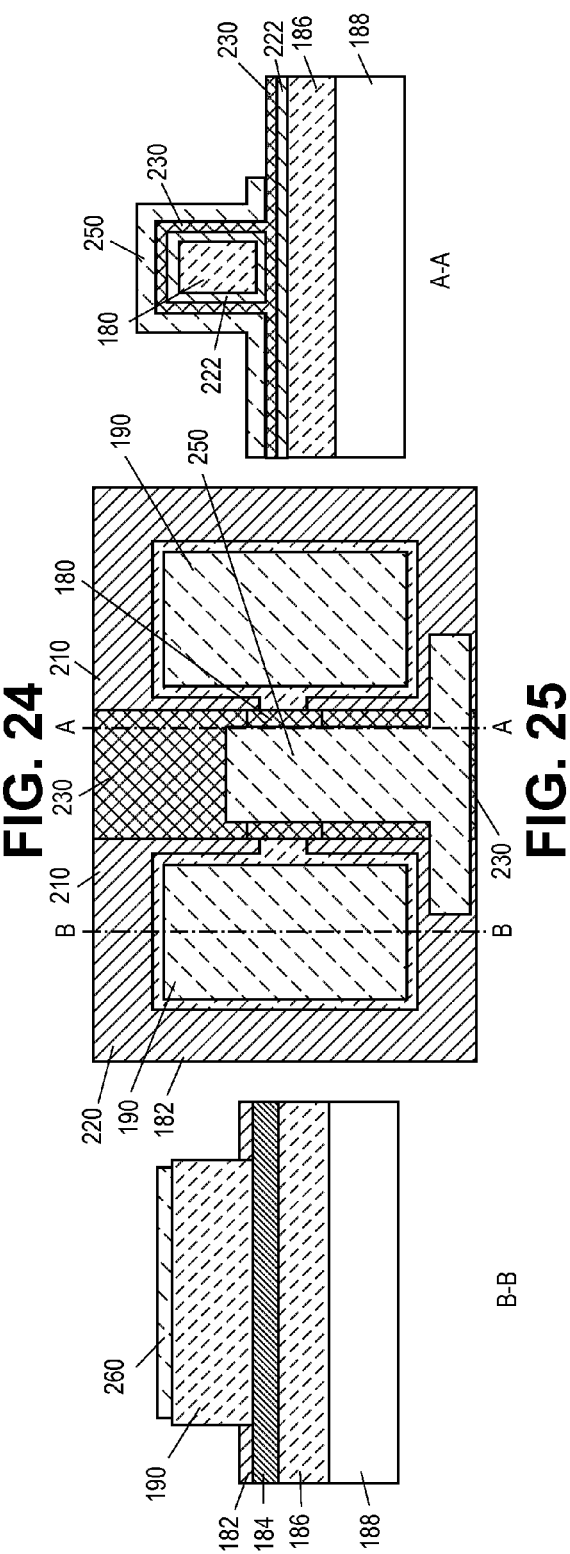

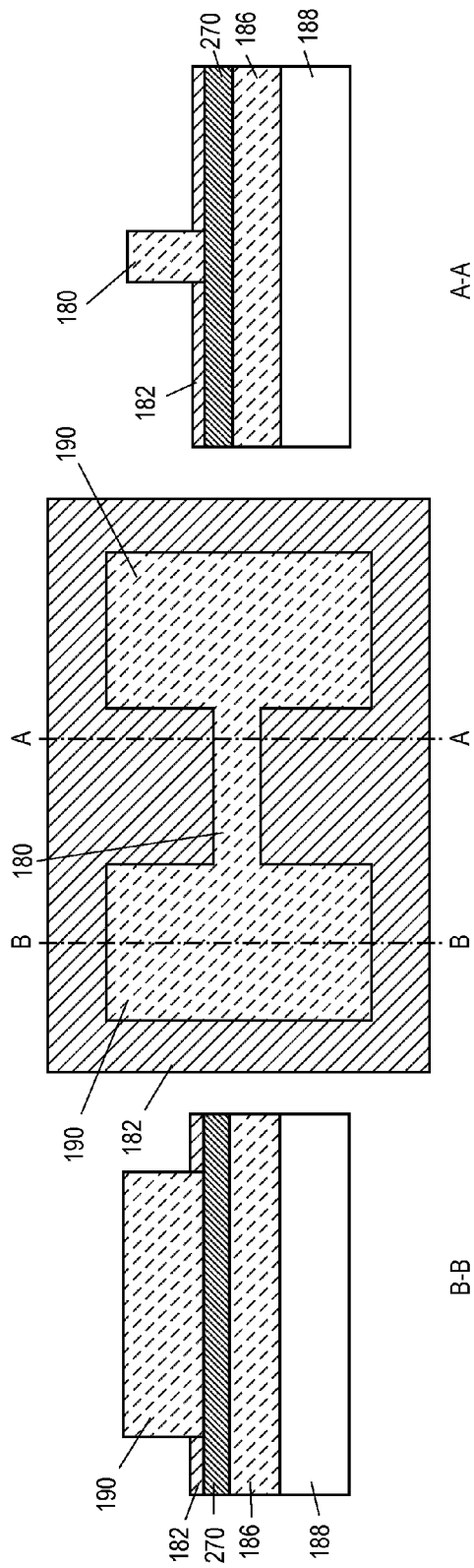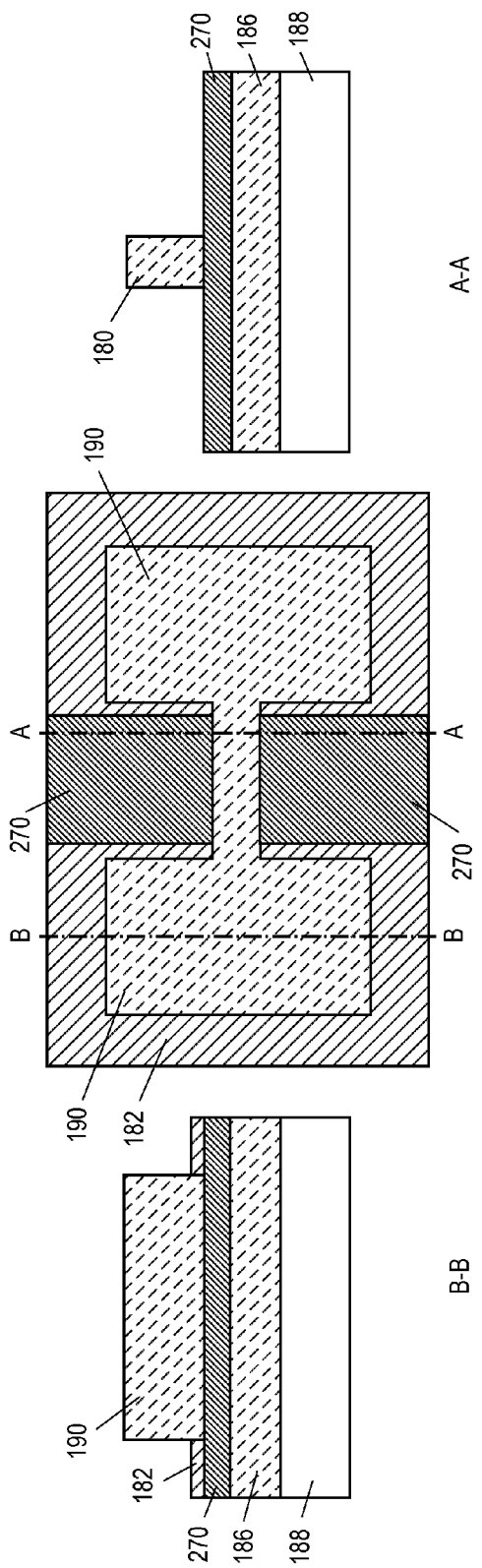

GATE-ALL-AROUND METAL-OXIDE-SEMICONDUCTOR TRANSISTORS WITH GATE OXIDES

PRIORITY

This application claims priority to provisional U.S. Patent Application Ser. No. 61/752,741 filed Jan. 15, 2013, the disclosure of which is herein incorporated by reference in its entirety.

This invention was made with government support under Grant No. HDTRA1-II-I-0021 awarded by the Defense Threat Reduction Agency (DTRA). The government may have certain rights in the invention.

TECHNICAL FIELD

The present teachings relate to the field of semiconductor devices and more particularly to a method and structure for a device having a floating current channel that is completely surrounded by a dielectric layer that is in turn surrounded by a gate electrode.

BACKGROUND

In a nanoscale regime, the performance of field effect transistors (FETs) is challenged by current leakage through a body of the semiconductor as well as transport through an inversion layer defined by single-sided (top) gate electrode, for example as found with a planar transistor. This leakage is usually ignored in macro/micro-scale devices since these devices are properly understood with one-dimensional physics. Traditional FET designs apply the gate from the top surface of the transistor device. As device dimensions continue to shrink to about 10 nm, a single sided transistor gate does not provide sufficient control, as evidenced by increases in sub-threshold current and more gradual transition as the device is switched.

Recent advances in transistor technology include a tri-gate transistor which has gate portions around three sides of the channel. This structure is similar to a FinFET design, for example as discussed in "A comprehensive review on microwave FinFET modeling for progressing beyond the state of art," G. Crupi, D. M. M.-P. Schreurs, J.-P. Raskin and A. Caddemi, Solid-State Electron. 80, 81-95 (2013). In all nanowire FET geometries, it is necessary to provide low resistance contacts between the source, the nanowire conductance region, and the drain, and to provide a high-resistance insulating layer (e.g., gate oxide) between the gate electrode and the conducting nanowire channel. In Si-based FETs, $SiO_2$ is most often used for this layer, although there has been intensive research in higher dielectric constant materials as device scaling has progressed into the nanoscale regime. In FETs using a Group III-V semiconductor as a bulk material, an insulating gate oxide is necessary to enhance device performance and lifetime by suppressing gate current. An alternative is to use a higher bandgap III-V alloy in a metal-semiconductor FET (MESFET) geometry, but the lower bandgap difference between the III-V alloys comprising the conducting and isolating layer restrict device performance. GaN-based devices are often configured as high electron mobility transistors (HEMTs) due to the large intrinsic channel conductance, which is caused by the spontaneous formation of a two-dimensional electron gas (2DEG) at the AlGaN/GaN interface. Such devices typically utilize $SiO_2$ or $SiN_x$ as a gate insulator, but the high resistivity of GaN-based materials also permits the use of semi-insulating AlGaN layers to isolate the gate from the channel.

Much of the recent discussion of nanowire transistors has been focused on a vertical geometry where the nanowires are grown perpendicular to the substrate semiconductor material. For a recent review see, J. K. Hyun, S. Zhang and L. J. Lauhon, *Nanowire Heterostructures*, Ann. Rev. Mat'l Res. 43, 451-479 (2013). This results in several difficult fabrication issues in using these nanowires in complex circuits. In particular, low resistance, ohmic contact has to be made to the very small cross section at the as-grown tip of the vertical nanowires, a difficult metallurgical problem. Second, vertical nanowires are often grown by a vapor-liquid-solid process using metal seeds that results in somewhat random positioning and significant variations in wire diameters, as well as the potential for deep level impurity incorporation into the nanowires. Third, it is difficult to envision nanowire size selection and placement technologies for the manufacture of interconnected circuit geometries involving many transistors in series/parallel combinations as is customary in today's integrated circuits.

In contrast, all of the device geometries disclosed herein provide for nanowires parallel to, but isolated from, the substrate surface. Contacts are based on single crystal semiconductor interfaces to larger area bulk semiconductors where the contact metallurgy is well developed. The wire geometries are defined by lithographic processes allowing for controlled and uniform nanowire dimensions, complex and flexible interconnection geometries. Materials are grown by homogeneous and heterogeneous epitaxial processes or etched by well developed processes known to produce only low concentrations of defects and without the need for metal seeds. Also, these lithographically defined geometries provide versatility in designating the length and lateral dimensions of the gates, directly related to the level of drain current and transconductance for various applications, and circuit layout interconnections.

SUMMARY

The following presents a simplified summary in order to provide a basic understanding of some aspects of one or more embodiments of the present teachings. This summary is not an extensive overview, nor is it intended to identify key or critical elements of the present teachings nor to delineate the scope of the disclosure. Rather, its primary purpose is merely to present one or more concepts in simplified form as a prelude to the detailed description presented later.

In an embodiment, a method for forming a semiconductor device may include forming a transistor channel comprising a continuous single crystal floating nanowire over a semiconductor wafer surface, wherein the transistor channel is formed parallel to the semiconductor wafer surface, the transistor channel is electrically coupled at a first end to a semiconductor source and at a second end to a semiconductor drain, the floating nanowire comprises a floating portion between the first end and the second end, and the semiconductor source, the semiconductor drain, and the floating nanowire are formed from a single epitaxial layer structure and are continuously connected to each other. The method may further include forming a transistor gate oxide on the floating portion of the floating nanowire wherein, in a cross section of the floating portion, the transistor gate oxide completely surrounds the floating portion of the floating nanowire, and forming a transistor gate metal on the transistor gate oxide.

In another embodiment, a transistor may include a transistor channel comprising a floating nanowire, a transistor gate oxide on a surface of the transistor channel wherein, in a cross section of the floating nanowire, the transistor gate oxide completely surrounds the floating nanowire, and a transistor gate metal physically contacting the transistor gate oxide wherein, in the cross section of the floating nanowire, the transistor gate metal completely surrounds the transistor gate oxide.

In another embodiment, a method for forming a semiconductor device may include providing a crystalline silicon layer overlying a first silicon dioxide layer, wherein the crystalline silicon comprises a first thickness, oxidizing a transistor channel region of the crystalline silicon to thin the crystalline silicon at the transistor channel region to a second thickness while a semiconductor source region and a transistor channel region remain unoxidized, forming a first patterned mask to cover the semiconductor source region, the semiconductor drain region, and the transistor channel region while other portions of the crystalline silicon remain exposed, oxidizing the exposed regions of the crystalline silicon while the semiconductor source region, the semiconductor drain region, and the transistor channel region are covered by the patterned mask, removing the first patterned mask after oxidizing the exposed regions of the crystalline silicon, forming a second patterned mask to cover the semiconductor source region and the semiconductor drain region, and leaving the transistor channel region exposed, etching silicon dioxide surrounding the transistor channel region to form a floating nanowire bridged between the semiconductor source region and the transistor channel region, while the semiconductor source region and the semiconductor drain region are covered by the second patterned mask, then removing the second patterned mask, forming a transistor gate oxide on the floating nanowire wherein, in a cross section of the floating nanowire, the transistor gate oxide completely surrounds the floating nanowire, and forming a transistor gate metal surrounding the transistor gate oxide.

In another embodiment, a method for forming a semiconductor device may include providing an epitaxially grown sacrificial layer on a first gallium nitride (GaN) layer, wherein the sacrificial layer comprises an InGaN alloy, providing a patterned second epitaxial GaN layer on first portions of the sacrificial layer while second portions of the sacrificial layer remain uncovered by the second GaN layer, wherein the patterned second GaN layer defines a semiconductor source region, a semiconductor drain region, and a transistor channel interposed between, and connected to, the semiconductor source region and the semiconductor drain region, forming a dielectric layer on the second portions of the sacrificial layer, and patterning the dielectric layer, wherein a portion of the dielectric layer remains at a location lateral to the transistor channel region. The method may further include, subsequent to patterning the dielectric layer, etching the sacrificial layer using an etch that undercuts the patterned dielectric layer to remove the sacrificial layer from under the transistor channel region to form a floating nanowire bridged between the semiconductor source region and the transistor channel region. Further, after forming the floating nanowire, removing the patterned dielectric layer, forming a transistor gate oxide on the floating nanowire wherein, in a cross section, the transistor gate oxide completely surrounds the floating nanowire, and forming a transistor gate metal surrounding the transistor gate oxide.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures:

FIGS. 1-12 depict plan views and cross sections of various in-process structures during a method for forming a gate-all-around MOS transistor in accordance with an embodiment of the present teachings;

FIGS. 13-16 depict plan views and cross sections of various in-process structures during a method for forming a gate-all-around MOS transistor in accordance with another embodiment of the present teachings;

FIGS. 18-25 depict plan views and cross sections of various in-process structures during a method for forming a gate-all-around MOS transistor in accordance with another embodiment of the present teachings; and FIGS. 26-29 depict plan views and cross sections of various in-process structures during a method for forming a gate-all-around MOS transistor in accordance with another embodiment of the present teachings.

Figure 17:
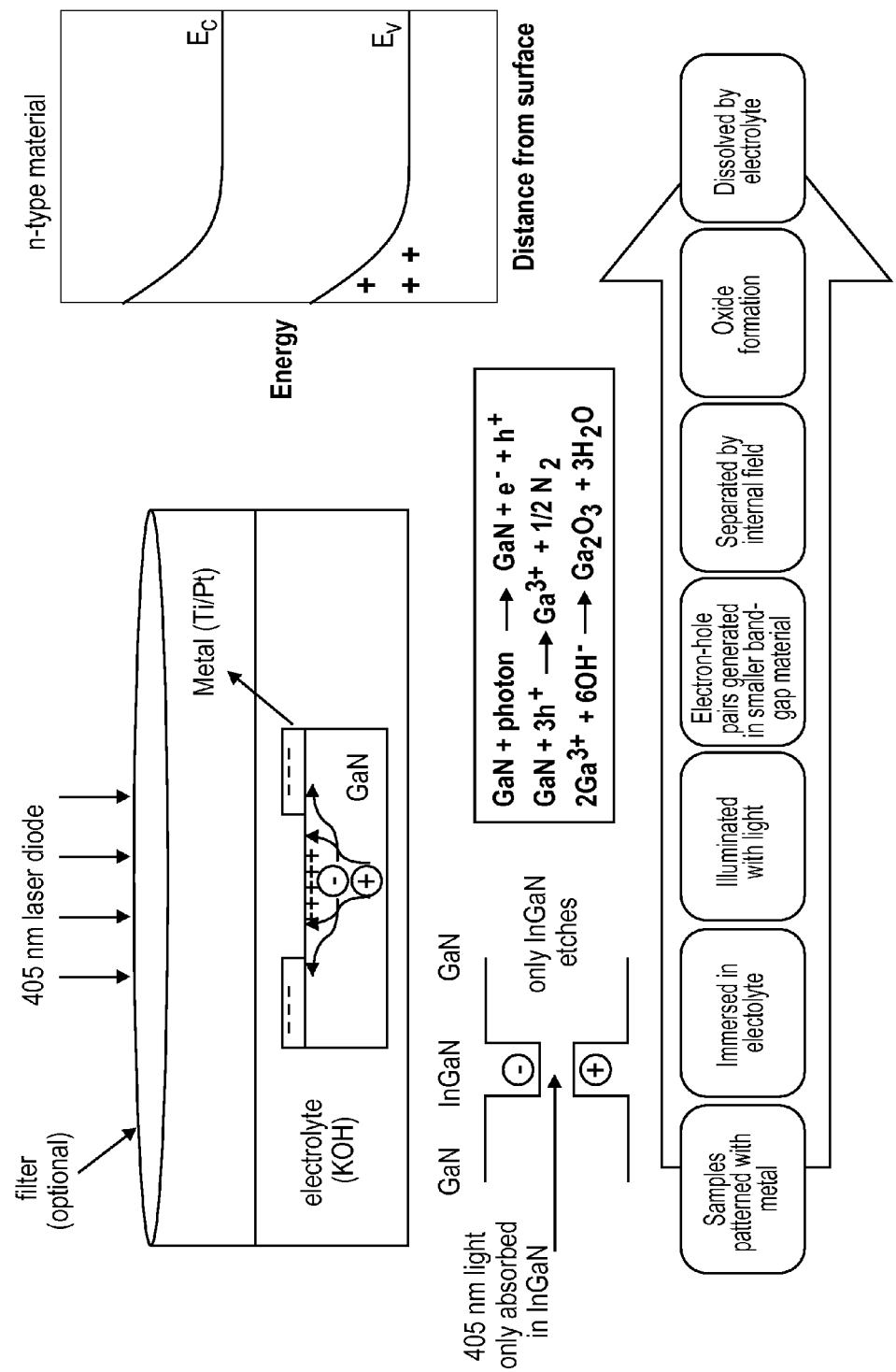
FIG. 17 shows an example of a band-gap-selective photoelectrochemical (PEC) etching set up that can be used to etch indium-gallium-nitride with little or no etching of gallium nitride.

It should be noted that some details of the FIGS. have been simplified and are drawn to facilitate understanding of the present teachings rather than to maintain strict structural accuracy, detail, and scale.

DETAILED DESCRIPTION

An embodiment of the present teachings may employ a well-defined floating nanowire (e.g., a nanowire suspended above the substrate and with low resistance, ohmic contacts to semiconductors or metals at each end) as the current channel for current control from source to drain. To achieve a floating nanowire as the current channel, the material used for gate oxide surrounding the transistor channel should be selected for its quality as a gate oxide and its compatibility with nanowire FET processing. For purposes of this disclosure, a "floating portion" is a portion of a structure that, in a cross section, is not in direct physical contact with another conductive or semiconductive structure at the location of the cross section. A "floating nanowire" is a channel structure that, in a cross section, is not in direct physical contact with another conductive or semiconductive structure at the location of the cross section. In embodiments, an entire transistor channel between a transistor source and a transistor drain may be floating. In embodiments, the transistor source, transistor drain, and transistor channel (i.e., the floating nanowire) may be formed from the same single crystal semiconductor layer, for example the same GaN layer; additional processes such as deposition, etching, implantation, and oxidation can be applied to the transistor source, transistor drain, and transistor channel separately after epitaxial growth for reducing resistance of the ohmic contacts at its ends and enhancement of its electrical isolation from gate metal.

Fabrication approaches are presented below for both III-V materials, employing nanoscale epitaxial growth, and for silicon materials. An embodiment of the present teachings can include the use of III-V oxides formed by liquid phase chemical-enhanced oxidation (LPCEO) which is a low-temperature process suitable for III-V and provides thermally stable materials, as gate oxides for III-V metal-oxide-semiconductor (MOS) FETs. See, for example Wang et al., Jpn. J. Appl. Phys., 37, L67 (1998), which is incorporated herein by reference in its entirety. Another alternative is the use of atomic layer deposition (ALD) to provide a dielectric material surrounding the nanowire. See, for example, P. D. Ye et al., Appl. Phys. Lett. 83, 180 (2003), which is incorporated herein by reference in its entirety.

Embodiments of the present teachings can include a fully surrounded transistor channel with a gate-all-around configuration. Concepts are discussed for devices using a III-V semiconductor material as well as devices using a silicon semiconductor material. Fabrication of such devices requires a significant change in processes as compared with the traditional single sided gate (typically defined on a flat surface) and even a tri-gate (defined on a mesa etched into or grown from the semiconductor material) in order to provide gate oxide and metallizations that fully surround the gate region.

An embodiment of the present teachings may provide a floating current channel between source and drain that is surrounded with Group III oxide generated by LPCEO. Gate metal may be deposited onto the floating current channel using a conformal coating technique. The floating structure is available for the current channel when it is formed by selective epitaxial growth with faceting that leads to 3-dimensional shaping of an epilayer. See, for example, Lee et al., Appl. Phys. Lett., 92, 023103 (2008), which is incorporated herein by reference in its entirety. The resulting structure is then a gate-all-around metal oxide semiconductor field effect transistor (MOSFET). Embodiments may be favorable for transistor devices having smaller channel widths, for example channel diameter or lateral dimension from atomic scale (from about 1.0 nm to about 2.0 nm) up to about 100 nm.

An embodiment of the present teachings including a FET device formation method, various in-process semiconductor structures, and a completed FET device are depicted in FIGS. 1-12. In each of FIGS. 1-12, the dashed vertical line labeled "A" indicates the location of the cross section at the channel region depicted in the corresponding figure portion labeled "A-A" and the dashed vertical line labeled "B" indicates the location of the cross section at the source or drain depicted in the corresponding figure portion labeled "B-B." The depicted device is described with reference to a gallium arsenide (GaAs) MOSFET using a III-V oxide such as $Ga_2O_3$ and $As_2O_3$ as a gate oxide, although it will be understood that other materials may be used. Another alternative is the use of atomic layer deposition to deposit a different gate oxide including, but not limited to, $Al_2O_3$ or $HfO_2$. Additionally, it will be appreciated that the figures are general depictions and that other structural components and/or processing stages may be added or existing structural components and/or processing stages may be removed or modified.

In FIG. 1, a GaAs FET layer 10 is prepared using, for example, a bottom-up process (i.e. selective epitaxy). The starting (large area blanket) wafer includes a high aluminum (Al) composition $Al_xGa_{1-x}As$ alloy layer 12 (where x is about 0.98) and a thin layer of GaAs to both provide a seed for the epitaxial growth and to isolate the Al-containing layer from air during the fabrication of patterned dielectric film 14. The regions where the selective epitaxial layers are to be added can be delineated with a dielectric film 14 such as silicon nitride (e.g., $Si_3N_4$) or silicon oxide (e.g., $SiO_2$). Note that, as depicted, the growth can proceed in an "H" geometry where both the nanowire and the (wider for lower resistance) source/drain regions are grown in the same epitaxial process. Additional layers of III-V materials may be used in the growth to form wrap-around quantum wells (QW). The QW can be overgrown with a passivation layer that has a larger bandgap, such as a GaAs or AlGaAs epitaxial layer which functions as a cladding layer that is part of the epitaxial growth (not separately identified in FIG. 1 and subsequent FIGS. for simplicity). A III-V semiconductor conducting channel, such as a quantum well grown around the floating nanowire, is sensitive to defects at the interface with any dielectric layer. One approach to passivate the edge of the conducting layer is to grow a higher bandgap semiconductor after growing the quantum well. The $Al_xGa_{1-x}As$ layer, and subsequent layers, may be formed over a substrate 16 that is part of a semiconductor wafer, for example a monocrystalline GaAs substrate 16, as depicted. For simplicity, only one transistor (source/channel/drain) is depicted. With current lithography capabilities, multiple such devices can be provided in a single growth allowing high-density and high-transistor-count integrated circuits.

In FIG. 2, optionally, the dielectric layer 14 (Cf., FIG. 1) used for defining the regions for epitaxial growth can be removed. A thick dielectric film 20 such as silicon oxide (e.g., $SiO_2$) can be deposited on exposed portions of the GaAs FET layer 10 as a protection layer against lateral wet oxidation during subsequent processing discussed below. As depicted in FIG. 3, a trench 30 may be etched to laterally expose the $Al_xGa_{1-x}As$ alloy layer 12 and a portion of the substrate 16.

Next, the side of the $Al_xGa_{1-x}As$ layer 12 of FIG. 3 is exposed to hot water vapor at the trench 30, for example in a furnace. This exposure laterally oxidizes the $Al_xGa_{1-x}As$ layer 12 to convert the material to aluminum oxide ($Al_2O_3$) layer 40 as depicted in FIG. 4. This electrically isolates the active nanowire region 42 (i.e., the transistor channel region) that is interposed between the transistor source/drain regions 44 from the substrate 16. This process also induces vertical oxidation of the GaAs transistor area 10 at the interface with the GaAs/$Al_xGa_{1-x}As$ layer 12 to form III-V oxide 46 formed from partially oxidized GaAs layer 12 near both the top and bottom interfaces of the $Al_2O_3$ layer 40. The vertical oxidation rate depends on the doping of the layer and is designed to proceed to completion for the top layer as depicted in FIG. 4. If any of the upper portion of the GaAs layer at the top of layer 40 remains (i.e., if portions of layer 10 remain unoxidized and exposed at the trench 30), any unoxidized GaAs may be etched or separately oxidized.

As depicted in FIG. 5, the $SiO_2$ protection layer 20 formed at FIG. 2 is removed and the initial dielectric film 14 used in patterned growth of GaAs layer 10, if it still remains, is removed, for example with dry etching. During the removal of the $SiO_2$, an etchant known in the art is used that provides selectivity for etching $SiO_2$ while etching the $Al_2O_3$, $Ga_2O_3$, or $As_2O_3$ layers not at all or at a much slower rate.

As depicted in FIG. 6, a patterned mask 60, such as a photoresist layer, is formed. The patterned mask 60 defines an area for gate oxide (e.g., $Ga_2O_3$) on the channel region with photo- or e-beam-resist by lithography.

In FIG. 7, an LPCEO process is performed. The LPCEO process can include dipping the wafer into an LPCEO solution for oxidation of GaAs to form a III-V oxide layer 70 surrounding the transistor channel region 42.

Next, the FIG. 7 structure is exposed to an etchant such as hydrofluoric acid (HF) to completely remove the exposed oxide layers 46, 70, which may also partially remove exposed portions of $Al_2O_3$ layer 40. This forms a floating current channel area 42 that is bridged between the source/drain regions 44 as depicted in FIG. 8. During this etching process, the $Al_2O_3$ layer 40 has an etch rate which is slower than an etch rate of the $Ga_2O_3$ material 46, 70, or has a greater thickness than the $Ga_2O_3$ or $As_2O_3$ material, and this etch rate difference or thickness difference is employed to ensure that exposed $Ga_2O_3$ and $As_2O_3$ materials 46, 70 are completely removed while the $Al_2O_3$ layer 40 is not over-etched. The channel region 42 is thus separated from the $Al_2O_3$ layer 40 as depicted and thereby keeps its floating state, isolated from any remaining $Al_2O_3$ layer 40.

Several iterations of forming III-V oxide layer 70 using LPCEO and dipping the wafer in HF can be performed to slowly remove the $Al_2O_3$ layer 40 from under the floating channel region 42 until the gap between the bottom of the floating channel region 42 and the upper surface of the $Al_2O_3$ layer 40 is sufficient to ensure uniform conformal deposition of a gate metal during subsequent processing as described below. Once the gap between the GaAs 10 of channel 42 and the $Al_2O_3$ layer 40 is sufficient, the $Ga_2O_3$ and $As_2O_3$ material 70 formed during a final LPCEO process is kept as a transistor gate oxide 90 as illustrated in FIG. 9. As depicted, the oxidation process can impact the cross-sectional shape and faceting of the nanowire 10. This is not a requirement of the process. In an alternative, transistor gate oxide 90 may be formed with an ALD process and can be formed from $Al_2O_3$ or $HfO_2$, or another suitable oxide material. The gap separates the bottom of the gate oxide 90 and the top of the $Al_2O_3$ layer 40, and the channel region 42 is floating and bridged between the source/drain regions 44 and thereby forms a floating nanowire conductive channel.

As depicted in FIG. 10, the gate metal 102 is deposited around the GaAs floating nanowire channel region 42 using a conformal coating technique, for example an atomic layer deposition (ALD) process. The ALD deposition results in gate metal 102 formed over all exposed surfaces as depicted.

Subsequently, the gate metal 102 that overlies the resist layer 60, as well as the resist 60 itself, are removed using, for example, an organic solvent. The organic solvent does not attack the gate metal 102 itself, but instead removes (i.e., strips) the resist 60 underlying the gate metal 102. Stripping the resist 60 lifts the gate metal 102 from regions where the gate metal 102 overlies the resist 60, but leaves gate metal 102 in other regions where resist 60 is not formed. This strip of the resist layer 60 during this process results in a structure similar to that depicted in FIG. 11. In an alternative processing sequence, an additional lithography step (spin on photoresist, lithography exposure and develop, not individually depicted for simplicity) may be used to protect the gate area of channel region 42 allowing etching of the excess metal 102 and the prior photoresist 60. In another alternate process, a dielectric layer (not individually depicted for simplicity) may be deposited over the gate metal electrode as protection before the removal process. In another optional process, a blanket oxidation process may be performed to fill the space between the nanowire and layer 40 (Cf., FIG. 10, A-A), which is then removed from other wafer locations using a vertical anisotropic etch (not depicted for simplicity).

Next, a patterned gate metal pad 120 is formed, for example using standard photolithography, to provide a contact and interconnect to the gate metal 102 as depicted in FIG. 12. Wafer processing may then continue, for example using conventional techniques to provide a completed semiconductor device.

A similar concept can be applied to FETs having a silicon bulk semiconductor, where a floating nanowire section is bounded by faceting favorable for two dimensional control of source-to-drain current by employing $SiO_2$ formed using, for example, a thermal/wet-process as described below.

As depicted in FIG. 13, a silicon-on-insulator wafer 130 including a silicon substrate 132, a thick bottom oxide (BOX) layer 134, and a thin silicon layer 136 having a thickness of, for example, about 100 nm, is provided.

Next, as depicted in FIG. 14, the silicon layer 136 in the transistor channel region 140 is selectively thinned to between about 10 nm to about 20 nm. To thin the silicon layer 136, a patterned mask (not individually depicted for simplicity) is formed on the structure surface, leaving exposed channel regions 140 and covering the source and drain regions 142, and other regions of the wafer as desired. The exposed regions at channel region 140 are oxidized to form silicon oxide (e.g., $SiO_2$) layer 144 and the oxidation process is halted when the exposed silicon is sufficiently thinned by conversion to $SiO_2$ to leave thin silicon layer 146 at the channel regions 140. The patterned mask is then removed to leave the structure of FIG. 14. The patterned mask is not individually depicted in FIG. 14 for simplicity, but leaves exposed the area where $SiO_2$ is depicted in FIG. 14 and covers the area where silicon remains on the surface of FIG. 14. Thinning the silicon in the channel region in this step sets the physical length of the channel 140.

Subsequently, as depicted in FIG. 15, another patterned mask 150 is formed as depicted that defines the width of the channel region 140, and also defines the source and drain regions 142. After formation of the FIG. 15 patterned mask 150, the exposed portions of the $SiO_2$ layer 144 in FIG. 14 are etched to expose the thinned silicon 146 underneath. After removal of the $SiO_2$ 144, the exposed silicon 136, 146 is oxidized to result in the FIG. 15 structure, including oxide 152. Exposed portions of thin silicon 146 are oxidized during processing of FIG. 14 to result in FIG. 15, and thus a top portion of the oxide layer 134 in FIG. 15 includes oxidized thin silicon layer 146. After this oxidation, the source and drain regions 142 (including silicon 136) and the channel regions 140 (including silicon 146) are defined.

As depicted in FIG. 16, a patterned mask 160 is formed which exposes the thin silicon 146 to define the channel region 140, which is a floating nanowire including the thin silicon 146 bridged between the source and drain regions 142. The oxide 134, 144 all around the active silicon floating nanowire 146 is stripped, for example with a buffered HF solution.

Next, the silicon floating nanowire is re-oxidized to provide an $SiO_2$ gate insulation (gate oxide) layer (not individually depicted for simplicity). Optionally, other gate oxides can be provided using, for example, an isotropic process such as atomic-layer deposition (ALD). This step is not individually illustrated and is in close parallel with the discussion presented above (see, for example, the oxidation of the nanowire to provide gate oxide 90 at FIG. 9).

Next, the source/drain regions can be masked and a gate metal can be deposited (not individually depicted for simplicity). The masking avoids contacting the source/drain regions 142 with the gate metal. This step is not individually illustrated and is in close parallel with the discussion presented above (see, for example, the metallization to form gate metal 102 at FIG. 10). Wafer processing can then continue as discussed above.

In another embodiment, a gallium nitride (GaN) gate-all-around transistor may be formed. GaN is a particularly promising next-generation channel material for FETs due to its wide band-gap, high breakdown field, and high saturation velocity. Gate-all-around GaN-based FETs are difficult to realize, for example because the high-bond strength in GaN precludes the use of conventional wet etching techniques. This generally prevents fabrication schemes in which material underneath the gate must be removed. However, photo-electrochemical (PEC) etching has been demonstrated as an effective means of wet etching GaN-based materials. As a result, gate-all-around GaN-based FETs may be realized by utilizing PEC etching, and more specifically, band-gap-selective PEC etching. FIG. 17 shows an example of a band-gap-selective PEC etching set up according to an embodiment of the present teachings. PEC processing is discussed in Tamboli et al., *Journal of The Electrochemical Society*, 156 10 H767-H771 (2009), which is incorporated herein by reference in its entirety.

In this embodiment, band-gap-selective PEC etching may include the use of differences in energy band gaps between GaN and indium-gallium-nitride (InGaN). While GaN only absorbs light at wavelengths shorter than ~370 nm, InGaN can be designed to absorb 405 nm or longer light. Therefore, when a GaN/InGaN sample is illuminated with 405 nm or longer light, only the InGaN will absorb light. As a result, photo-generated carriers will only occur in the InGaN layer. The InGaN layer will etch through surface oxidation based on the participation of photo-generated holes (as shown in FIG. 17), while the GaN will be unetched. This provides a method to selectively remove InGaN from GaN. This technique may be used to form gate-all-around GaN-based transistors as described herein.

Figure 18:
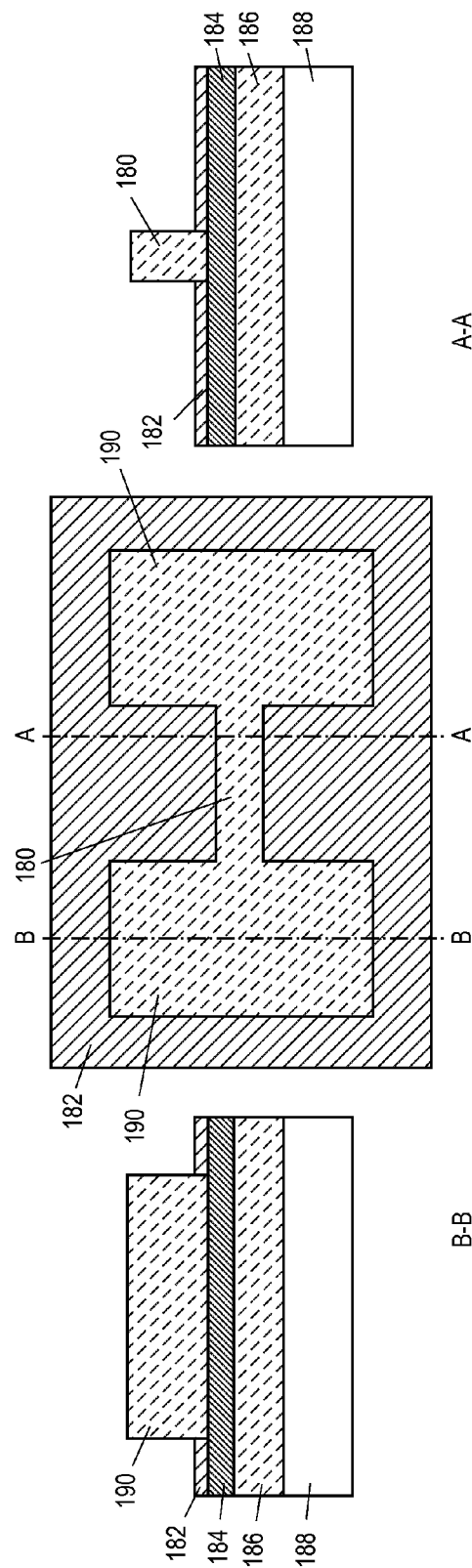

FIGS. 18-26 illustrate a gate-all-around transistor process for GaN using band-gap-selective PEC etching in accordance with an embodiment of present teachings. Initially, as depicted in FIG. 18, a patterned GaN layer is grown, which includes a horizontal floating nanowire (or nanowall) GaN structure 180 and patterned source/drain regions 190, using patterned selective-area epitaxy. Other suitable techniques may also be used to form the pattern, including planar growth followed by dry etching. The patterned epitaxy process includes the formation of a patterned dielectric layer 182 on a planar InGaN layer 184, which is formed over a planar GaN layer 186 and a semiconductor substrate 188 such as a silicon substrate that is part of a semiconductor wafer. The patterned GaN layer is then grown at regions exposed through openings in the patterned dielectric layer 184 to form the GaN floating nanowire 180 and the patterned source/drain regions 190. InGaN layer 184 provides a sacrificial etch layer embedded between the GaN floating nanowire 180 and the GaN layer 186, and also between the GaN source/drain regions 190 and the GaN layer 186. The dielectric film 182 used for the selective area epitaxy remains around the patterned GaN layer 180.

Figure 19:
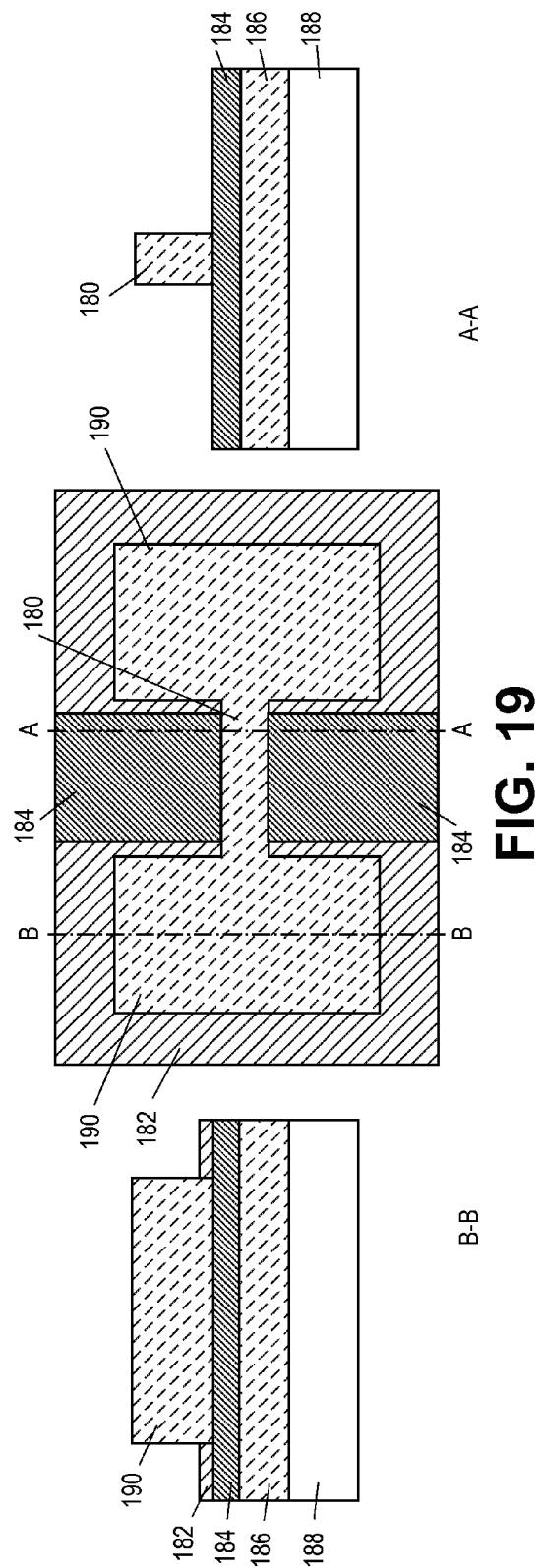

Next, portions of the dielectric film 182 are removed using a patterned mask (not depicted for simplicity) and standard lithography to expose portions of the sacrificial InGaN layer 184 as depicted in FIG. 19. The individual photolithography steps have not been shown for simplicity and include known deposition and etching techniques. The structure of FIG. 19 is then immersed in an electrolyte (e.g., KOH) and illuminated with a wavelength of light that is absorbed in the InGaN layer 184 but transmitted through the GaN layer 180, 190, for example a 405 nm laser line. The InGaN layer 184 may then be etched, leaving the GaN layer 180, 190, as a result of band-gap-selective PEC etching. Because the GaN floating nanowire 180 is very narrow, the InGaN layer 184 underneath the GaN floating nanowire 180 will be completely undercut very rapidly, as shown in FIGS. 20 and 21. The undercut degree on the remainder of the structure (e.g., the GaN source/drain areas 190) will be very small due the large size of these features relative to the size of the GaN floating nanowire 180. Lines 210 in FIGS. 21-23 depict the etch front, between which the InGaN layer is removed from around the transistor channel region.

After the channel floating nanowire 180 is undercut as depicted in FIGS. 20 and 21 a patterned mask 220, for example photoresist, may be formed over the exposed source/drain regions 190. Next, an all-around transistor gate oxide 222 may be deposited on exposed GaN surfaces by atomic layer deposition (ALD) or another sufficient technique, to result in a structure similar to that depicted in FIG. 22. The transistor gate oxide 222 also forms on the GaN layer 186 as depicted in A-A of FIG. 21, which may be used to electrically isolate GaN 186 from an all-around transistor gate metal 230. The all-around transistor gate metal 230 may be deposited by a conformal metal deposition technique to result in a structure similar to that depicted in FIG. 23. Subsequently, the patterned mask 220 may be removed from the FIG. 23 structure.

Next, a patterned gate electrode pad 250 may be formed as depicted in FIG. 24, and patterned source and drain electrode pads 260 may be formed as depicted in FIG. 25. Electrical operation and use of a FET using source/drain electrode pads 260 and channel electrode pads 250 is well known. FIG. 25 depicts a completed GaN-based gate-all-around FET in accordance with an embodiment of the present teachings. Wafer processing can then continue according to known techniques.

In another embodiment, the InGaN sacrificial layer 184 depicted in FIGS. 18-25 may be replaced with an aluminum-indium-nitride (AlInN) layer 270 that may be oxidized and undercut using, for example, HF or another acid to remove the material underneath the gate. This process can include the use of oxidation and standard wet etching rather than band-gap-selective PEC etching. FIGS. 26-29 depict an illustration of this process. As various processing stages and structures have similarities to the process of FIGS. 18-25, this embodiment is briefly described herein for simplicity, and like structures are commonly numbered.

Initially, as depicted in FIG. 26, a patterned GaN layer is grown, which includes a horizontal floating nanowire (or nanowall) GaN structure 180 and patterned source/drain regions 190, using patterned selective-area epitaxy or other suitable techniques. The patterned epitaxy process includes the formation of a patterned dielectric layer 182 on a planar AlInN layer 270, which is formed over a planar GaN layer 186 and a semiconductor substrate 188 such as a silicon substrate that is part of a semiconductor wafer. The patterned GaN layer 180, 190 is then grown at regions exposed through openings in the patterned dielectric layer 184 to form the GaN floating nanowire 180 and the patterned source/drain regions 190. AlInN layer 270 provides a sacrificial etch layer embedded between the GaN floating nanowire 180 and the GaN layer 186, which will remain between the GaN source/drain regions 190 and the GaN layer 186. The dielectric film 182 used for the selective area epitaxy remains around the patterned GaN layer 180, 190.

Next, portions of the dielectric film 182 are removed using a patterned mask (not depicted for simplicity) and standard lithography to expose portions of the sacrificial AlInN layer 270 as depicted in FIG. 27. Other portions of the dielectric film 182 remain as depicted in FIG. 27. The individual photolithography steps have not been shown for simplicity and include known deposition and etching techniques. The exposed portions of the AlInN layer in FIG. 27 are oxidized, for example by anodic oxidation using a solution of nitrilotriacetic/potassium hydroxide (NTA/KOH). This oxidation converts the exposed AlInN 270 and the AlInN underlying the floating nanowire 180 to oxidized AlInN 290 as depicted in FIG. 28.

Figure 28:
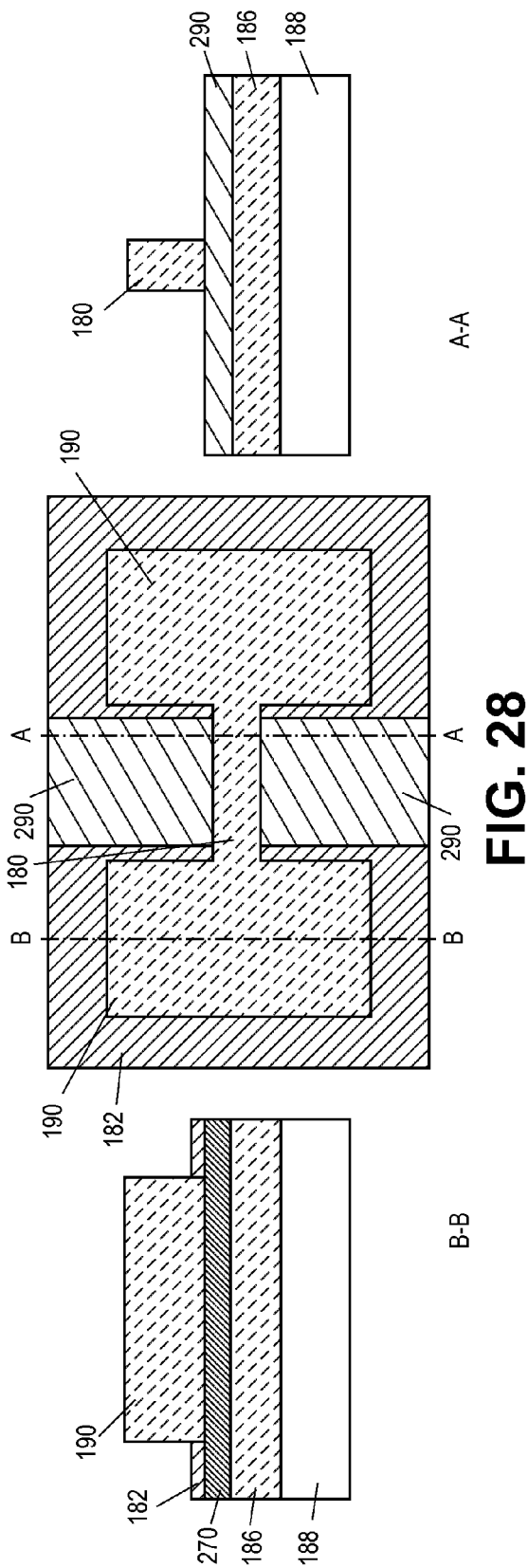
Figure 29:
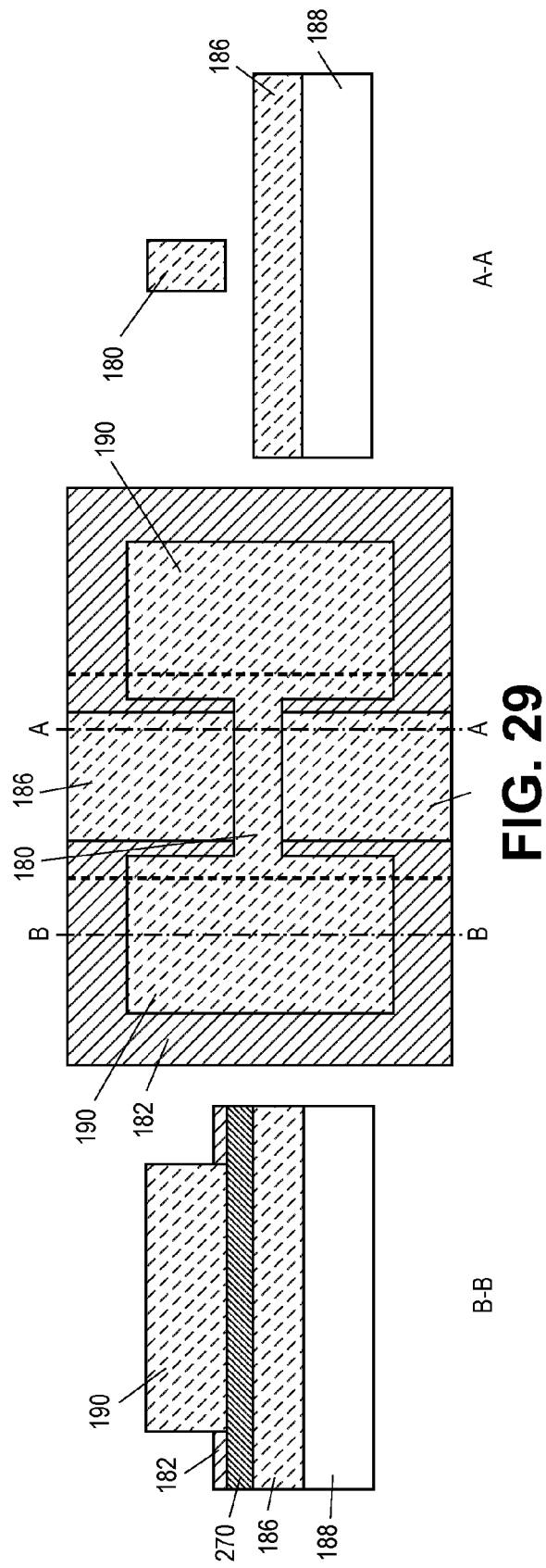

Subsequently, the structure of FIG. 28 is exposed to an etchant such as HF to completely remove the oxidized AlInN 290, which etches the oxidized AlInN 290 laterally under the floating nanowire 180, to result in a structure similar to that depicted in FIG. 29, where floating nanowire 180 is bridged and floating between source/drain regions 190. At this point in the process, the FIG. 29 structure is similar to the structure depicted in FIG. 21, and wafer processing may continue in a similar manner to form a completed structure similar to that depicted in FIG. 25.

The AlInN layer of FIGS. 26-29 may be replaced with a binary AlN layer. A process using a binary AlN layer in place of the AlInN layer 270 may be analogous to the process depicted and described with reference to FIGS. 26-29. The oxidation process is discussed in Butte et al. J. Phys. D: Appl. Phys. 40 (2007) 6328-6344, which is incorporated herein by reference in its entirety.

Some specific components of various embodiments of the present teachings may include the following:

1. Insertion of a sacrificial InGaN layer underneath the nanowire channel and subsequent use of band-gap-selective PEC etching to remove the InGaN layer underneath the channel can be used to form gate-all-around GaN-based FETs.

2. Insertion of an oxidizable AlInN layer underneath the nanowire channel and subsequent oxidation of the AlInN and standard wet etching (e.g., with HF or another acid) to remove the oxidized AlInN layer underneath the channel can be used to form gate-all-around GaN-based FETs.

An embodiment of the present teachings may thus provide a transistor method and structure wherein, in cross section, the transistor gate oxide and the transistor gate metal completely surround the nanowire (e.g., surround the floating nanowire through 360°) and thus provide a "gate-all-around" metal oxide semiconductor transistor with gate oxide. For example, the cross section A-A of FIG. 11 depicts transistor gate oxide 90 and transistor gate metal 102 completely surrounding nanowire 10 through 360°. Further, the cross section A-A of FIG. 23 depicts transistor gate oxide 222 and transistor gate metal 230 completely surrounding nanowire 180 through 360°.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A method for forming a semiconductor device, comprising:
    forming a transistor channel comprising a continuous single crystal floating nanowire over a semiconductor wafer surface, wherein:
        the transistor channel is formed parallel to the semiconductor wafer surface;
        the transistor channel is electrically coupled at a first end to a semiconductor source and at a second end to a semiconductor drain;
        the floating nanowire comprises a floating portion between the first end and the second end; and
        the floating nanowire is formed using a process comprising locally oxidizing a sacrificial epitaxial layer that underlies the nanowire channel and then etching the sacrificial epitaxial layer wherein, subsequent to etching the sacrificial epitaxial layer, the transistor channel comprises the floating nanowire; and
        the semiconductor source, the semiconductor drain, and the floating nanowire are formed from a single epitaxial layer structure and are continuously connected to each other;
    forming a transistor gate oxide on the floating portion of the floating nanowire wherein, in a cross section of the floating portion, the transistor gate oxide completely surrounds the floating portion of the floating nanowire;
    forming a transistor gate metal surrounding the transistor gate oxide; and forming semiconductor source, semiconductor drain, and transistor gate metallizations.

2. The method of claim 1, further comprising:
patterning a selective growth mask over a substrate in at least one transistor location over a sacrificial epitaxial layer;
performing a selective epitaxial growth of a semiconductor body to form a source region, a drain region and a nanowire channel region in the at least one transistor location; then
performing the etching of the sacrificial epitaxial layer that underlies the nanowire channel under the nanowire channel region of the semiconductor body to expose a lower surface of the semiconductor body, wherein, subsequent to etching the sacrificial layer, the transistor channel comprises the floating nanowire.

3. The method of claim 1, further comprising:
forming a semiconductor layer over a sacrificial layer;
etching the semiconductor layer to define the transistor source, the semiconductor drain, and the transistor channel; and
etching the sacrificial layer to expose a lower surface of the transistor channel wherein, subsequent to etching the sacrificial layer, the transistor channel comprises the floating nanowire.

4. The method of claim 3, further comprising forming the semiconductor layer from a Group III-V semiconductor layer.

5. The method of claim 3, wherein the formation of the sacrificial layer comprises forming at least one of a dielectric film, an epitaxial layer, and a glass layer.

6. The method of claim 3, wherein the formation of the sacrificial layer comprises forming a material selected from the group consisting of indium-gallium-nitride and aluminum-indium-nitride.

7. The method of claim 3, further comprising:
forming a gallium nitride (GaN) layer over an indium-gallium-nitride (InGaN) layer;
exposing the GaN layer and the InGaN layer to a light source outputting a wavelength of light, wherein the wavelength of light is absorbed by the InGaN layer and is not absorbed by the GaN layer; and
subsequent to exposing the GaN layer and the InGaN layer to the light source, exposing the GaN layer and the InGaN layer to an etch which removes the InGaN layer at a faster rate than it removes the GaN layer.

8. The method of claim 3, further comprising:
forming a gallium nitride (GaN) layer over an aluminum-indium-nitride (AlInN) layer;
oxidizing the AlInN layer to form an oxidized AlInN layer; and
exposing the GaN layer and the oxidized AlInN layer to an etch which removes the oxidized AlInN layer at a faster rate than it removes the GaN layer.

9. The method of claim 1, further comprising forming the transistor gate metal at the cross section to completely surround the floating nanowire and the transistor gate oxide.

10. A transistor, comprising:
a transistor source;
a transistor drain;
a transistor channel comprising a floating nanowire electrically coupled to the transistor source and the transistor drain;
a transistor gate oxide on a surface of the transistor channel wherein, in a cross section of the floating nanowire, the transistor gate oxide completely surrounds the floating nanowire;
a transistor gate metal physically contacting the transistor gate oxide wherein, in the cross section of the floating nanowire, the transistor gate metal completely surrounds the transistor gate oxide;
a semiconductor substrate underlying the floating nanowire, the transistor source, and the transistor drain;
a metal oxide that directly underlies the floating nanowire, the transistor source, and the transistor drain;
a III-V oxide, comprising:
a first portion that directly underlies the floating nanowire, the transistor source, and the transistor drain; and
a second portion that directly underlies the transistor source and the transistor drain, and does not directly underlie the floating nanowire,
wherein the metal oxide is interposed between the first portion of the III-V oxide and the second portion of the III-V oxide.

11. The transistor of claim 10, wherein:
the floating nanowire comprises a Group III-V semiconductor layer;
the semiconductor source region comprises the Group III-V semiconductor layer; and
the semiconductor drain region comprises the Group III-V semiconductor layer, wherein the floating nanowire is continuous with, and suspended between, the semiconductor source region and the semiconductor drain region.

12. The transistor of claim 11, wherein the floating nanowire provides the entire transistor channel for the transistor.

13. The transistor of claim 10, wherein the transistor gate metal, at the cross section, completely surrounds the floating nanowire and the transistor gate oxide.

14. A method for forming a semiconductor device, comprising:
providing a single crystal semiconductor substrate;
patterning a selective growth mask in at least one transistor location over the single crystal semiconductor substrate;
performing a selective epitaxial growth of a semiconductor body that comprises a sacrificial epitaxial layer and at least one device layer to define a transistor source, a transistor drain, and a transistor nanowire channel at the at least one transistor location;
locally oxidizing the sacrificial epitaxial layer at a location under the nanowire channel region of the semiconductor body to expose a lower surface of the at least one device layer;
etching the sacrificial epitaxial layer to form a nanowire channel having a floating portion;
forming a transistor gate oxide on the floating portion of the nanowire channel wherein, in a cross section of the floating portion of the nanowire channel, the transistor gate oxide completely surrounds the floating portion of the nanowire channel;
forming a transistor gate metal surrounding the transistor gate oxide; and
forming semiconductor source, semiconductor drain, and transistor gate metallizations.

15. A method for forming a semiconductor device, comprising:
providing a single crystal semiconductor substrate comprising a sacrificial epitaxial layer;
patterning a selective growth mask in at least one transistor location over the single crystal semiconductor substrate;
performing a selective epitaxial growth of the single crystal semiconductor substrate to form a semiconductor body comprising at least one device layer to form a transistor source region, a transistor drain region and a transistor channel region in the at least one transistor location;

locally oxidizing the sacrificial epitaxial layer under the transistor channel region of the semiconductor body to expose a lower surface of the at least one device layer;

etching the sacrificial epitaxial layer wherein, subsequent to the etching, the transistor channel region comprises a nanowire channel having a floating portion;

forming a transistor gate oxide on the floating portion of the nanowire channel wherein, in a cross section of the floating portion, the transistor gate oxide completely surrounds the floating portion of the nanowire channel;

forming a transistor gate metal surrounding the transistor gate oxide; and forming semiconductor source, semiconductor drain, and transistor gate metallizations, wherein the semiconductor source, the semiconductor drain, and the nanowire channel are formed from a single epitaxial layer structure and are continuously connected to each other.

* * * * *

UNITED STATES PATENT AND TRADEMARK OFFICE
CERTIFICATE OF CORRECTION

| | | |
|---|---|---|
| PATENT NO. | : 9,076,813 B1 | Page 1 of 1 |
| APPLICATION NO. | : 14/156176 | |
| DATED | : July 7, 2015 | |
| INVENTOR(S) | : Seung-Chang Lee, Steven Brueck and Daniel Feezell | |

It is certified that error appears in the above-identified patent and that said Letters Patent is hereby corrected as shown below:

In the Specification

Column 1, lines 11-14 should read as follows:

This invention was made with government support under Grant No. HDTRA1-II-I-0021 awarded by the Defense Threat Reduction Agency (DTRA). The government has certain rights in the invention.

Signed and Sealed this
Second Day of February, 2016

Michelle K. Lee
*Director of the United States Patent and Trademark Office*